United States Patent
Kikuchi

(10) Patent No.: US 9,425,170 B2
(45) Date of Patent: Aug. 23, 2016

(54) STACKED CHIPS ELECTRICALLY CONNECTED BY A PLURALITY OF JUNCTURE PORTIONS

(71) Applicant: ROHM CO., LTD., Kyoto (JP)

(72) Inventor: Hidekazu Kikuchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/541,461

(22) Filed: Nov. 14, 2014

(65) Prior Publication Data

US 2015/0137357 A1    May 21, 2015

(30) Foreign Application Priority Data

Nov. 18, 2013    (JP) ................................ 2013-238223

(51) Int. Cl.
*H01L 25/065*    (2006.01)
*H01L 25/00*    (2006.01)
(Continued)

(52) U.S. Cl.
CPC ...... *H01L 25/0657* (2013.01); *H01L 21/76898* (2013.01); *H01L 23/481* (2013.01); *H01L 23/49838* (2013.01); *H01L 23/585* (2013.01); *H01L 24/80* (2013.01); *H01L 24/92* (2013.01); *H01L 24/94* (2013.01); *H01L 25/043* (2013.01); *H01L 25/50* (2013.01); *H01L 24/11* (2013.01); *H01L 24/16* (2013.01); *H01L 24/29* (2013.01); *H01L 24/32* (2013.01); *H01L 24/73* (2013.01); *H01L 24/81* (2013.01); *H01L 24/83* (2013.01); *H01L 25/074* (2013.01); *H01L 25/0756* (2013.01); *H01L 2223/5446* (2013.01); *H01L 2223/54426* (2013.01); *H01L 2223/54453* (2013.01); *H01L 2224/08147* (2013.01); *H01L 2224/1148* (2013.01); *H01L 2224/13014* (2013.01); *H01L 2224/14181* (2013.01); *H01L 2224/16145* (2013.01); *H01L 2224/17181* (2013.01); *H01L 2224/33181* (2013.01); *H01L 2224/73104* (2013.01); *H01L 2224/73204* (2013.01); *H01L 2224/80895* (2013.01); *H01L 2224/80896* (2013.01); *H01L 2224/8113* (2013.01); *H01L 2224/81193* (2013.01); *H01L 2224/81203* (2013.01);
(Continued)

(58) Field of Classification Search
CPC ... H01L 25/074; H01L 25/043; H01L 25/117; H01L 25/0657; H01L 25/81; H01L 24/13; H01L 23/481; H01L 23/49838; H01L 25/0756
See application file for complete search history.

(56) References Cited

U.S. PATENT DOCUMENTS 5,821,625 A * 10/1998 Yoshida ................ H01L 21/563
257/659
2011/0074017 A1    3/2011 Morifuji et al.
(Continued)

FOREIGN PATENT DOCUMENTS

JP    2011-071441 A    4/2011

*Primary Examiner* — Alonzo Chambliss
(74) *Attorney, Agent, or Firm* — Rabin & Berdo, P.C.

(57) ABSTRACT

An inventive semiconductor device includes: a first semiconductor chip; a second semiconductor chip having a front surface opposed to a front surface of the first semiconductor chip; a first electrode region including a first electrode provided between the first semiconductor chip and the second semiconductor chip to electrically connect the first semiconductor chip to the second semiconductor chip; and a juncture portion provided between the first semiconductor chip and the second semiconductor chip as surrounding the first electrode region to connect the first semiconductor chip to the second semiconductor chip.

13 Claims, 17 Drawing Sheets

(51) Int. Cl.
*H01L 23/48* (2006.01)
*H01L 21/768* (2006.01)
*H01L 23/498* (2006.01)
*H01L 25/04* (2014.01)
*H01L 23/58* (2006.01)
*H01L 25/075* (2006.01)
*H01L 25/07* (2006.01)
*H01L 23/00* (2006.01)

(52) U.S. Cl.
CPC ............... *H01L 2224/83193* (2013.01); *H01L 2224/83203* (2013.01); *H01L 2224/83862* (2013.01); *H01L 2224/9202* (2013.01); *H01L 2224/94* (2013.01); *H01L 2225/06513* (2013.01); *H01L 2225/06541* (2013.01); *H01L 2924/0002* (2013.01); *H01L 2924/13091* (2013.01); *H01L 2924/15788* (2013.01)

(56) References Cited

U.S. PATENT DOCUMENTS

| | | | |
|---|---|---|---|
| 2013/0001802 A1* | 1/2013 | Koyanagi | H01L 23/481 257/777 |
| 2014/0220740 A1 | 8/2014 | Morifuji et al. | |

* cited by examiner

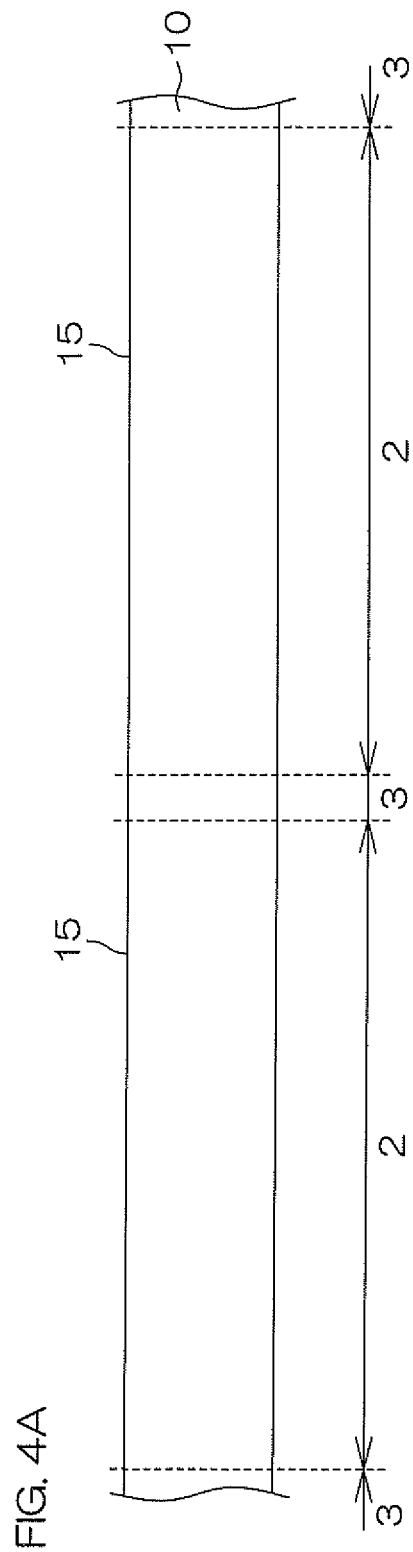

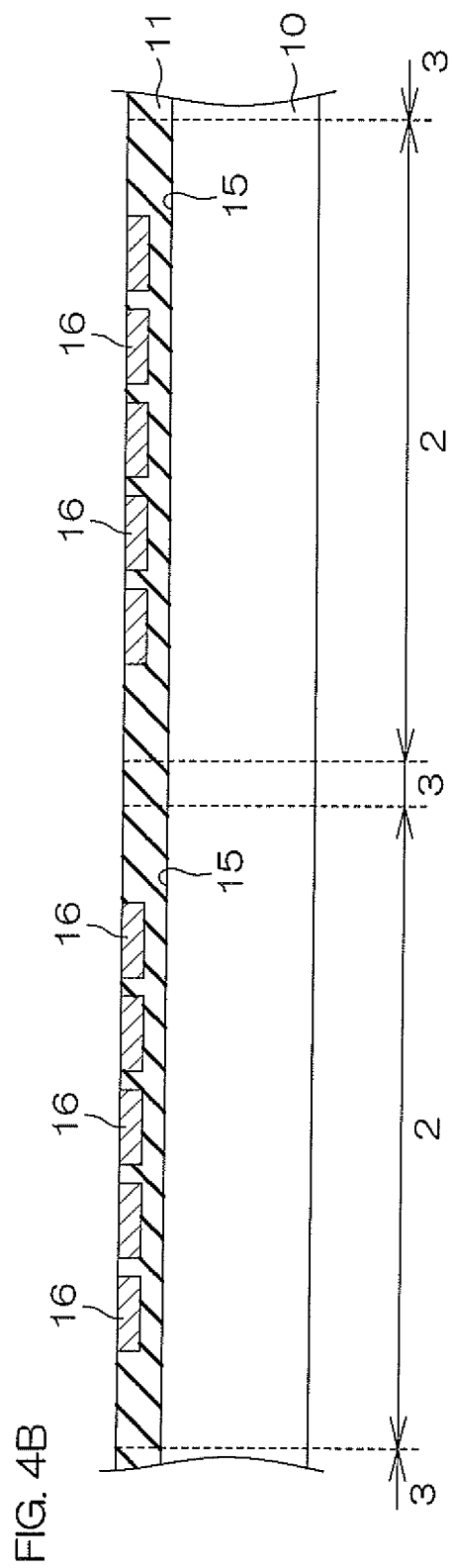

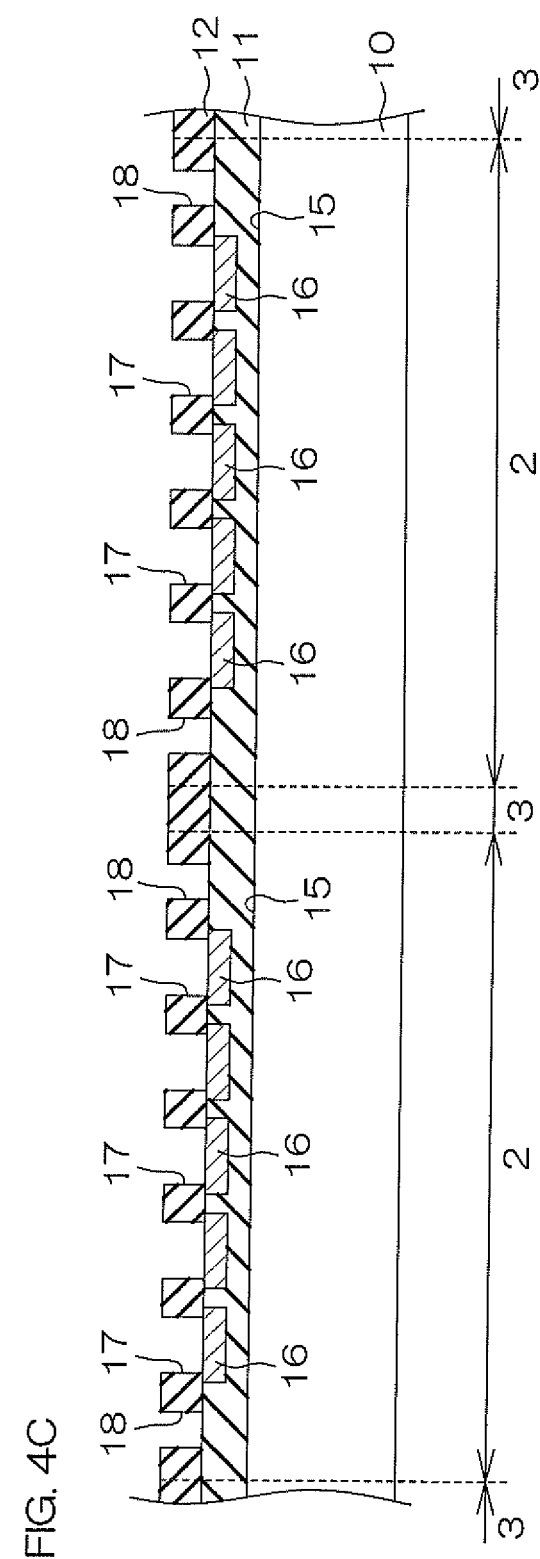

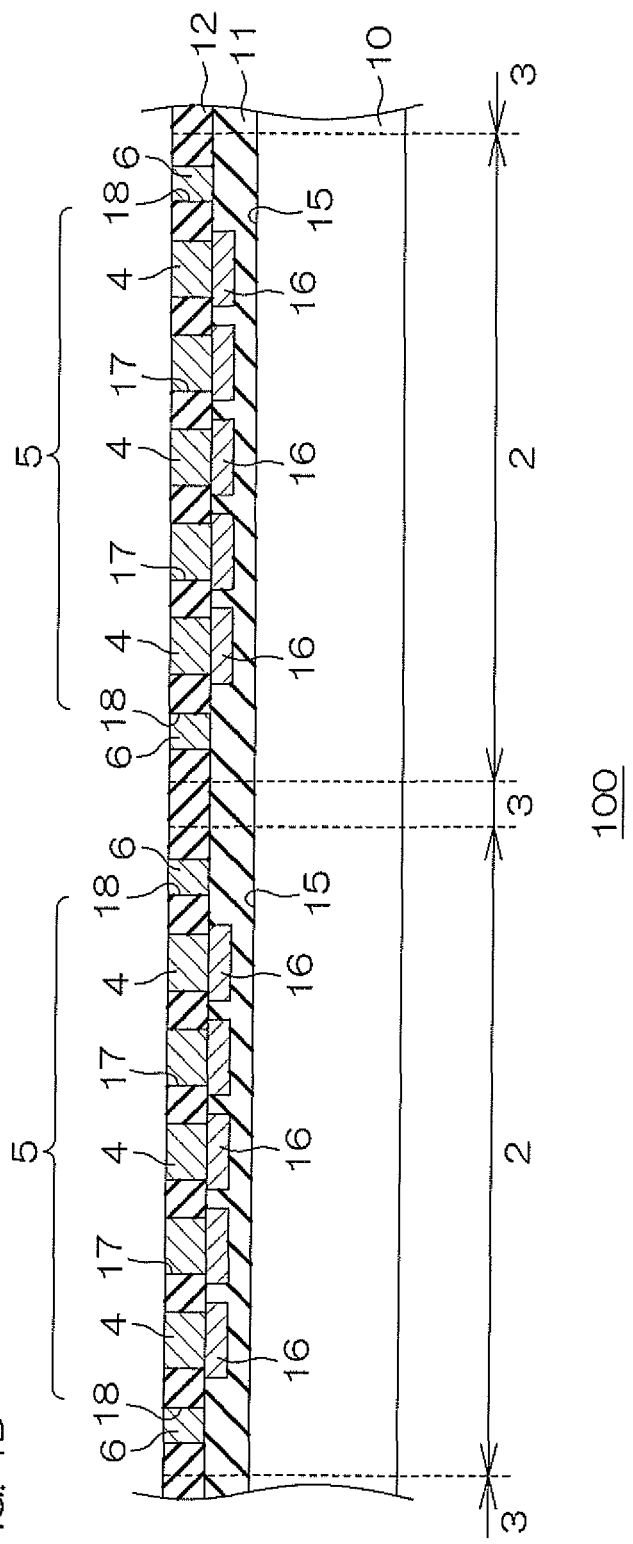

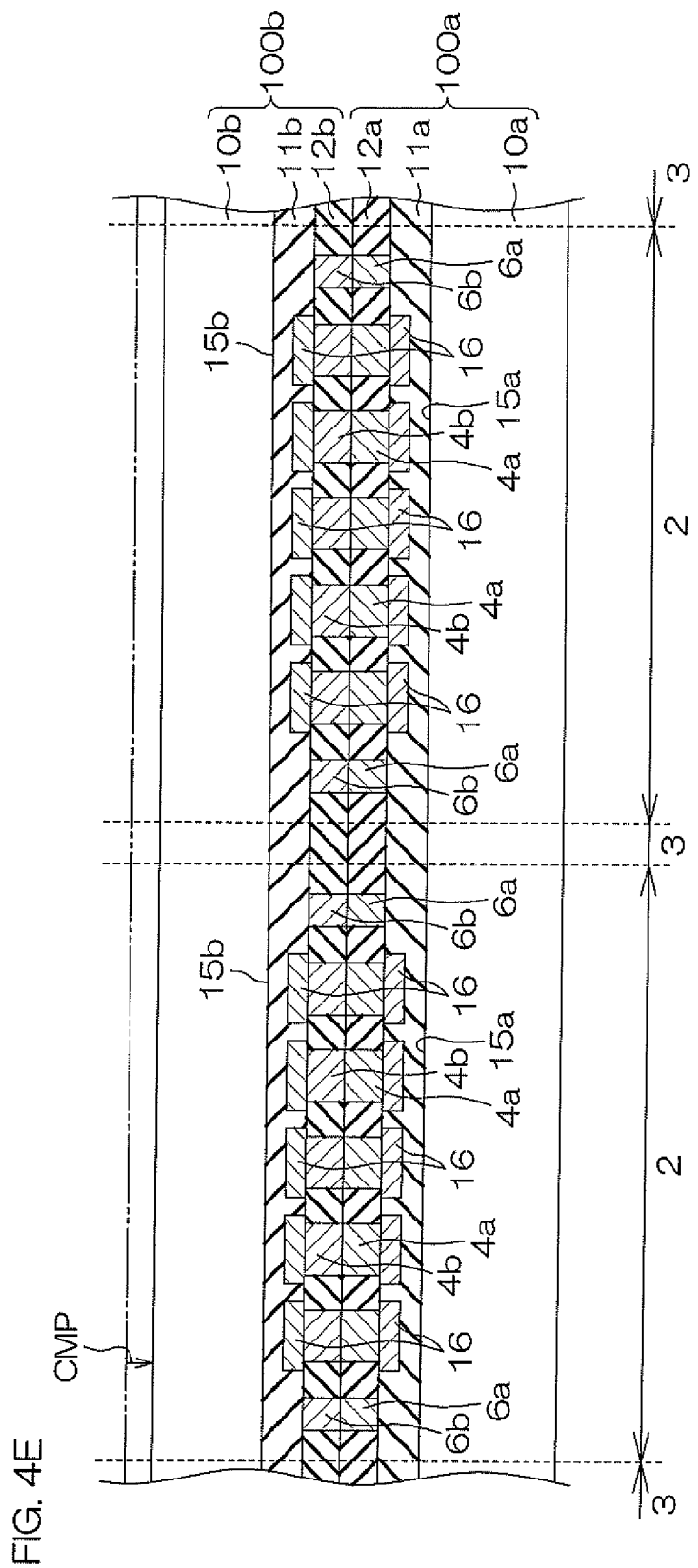

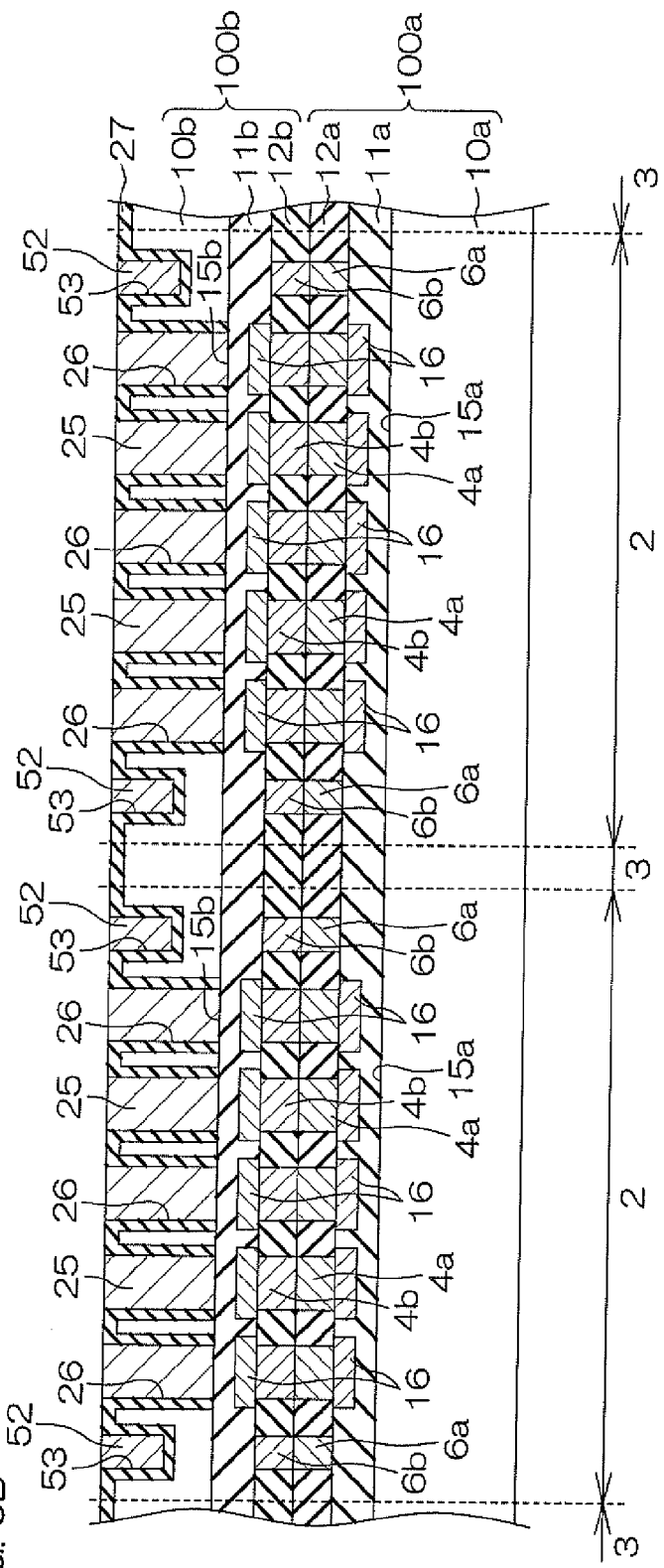

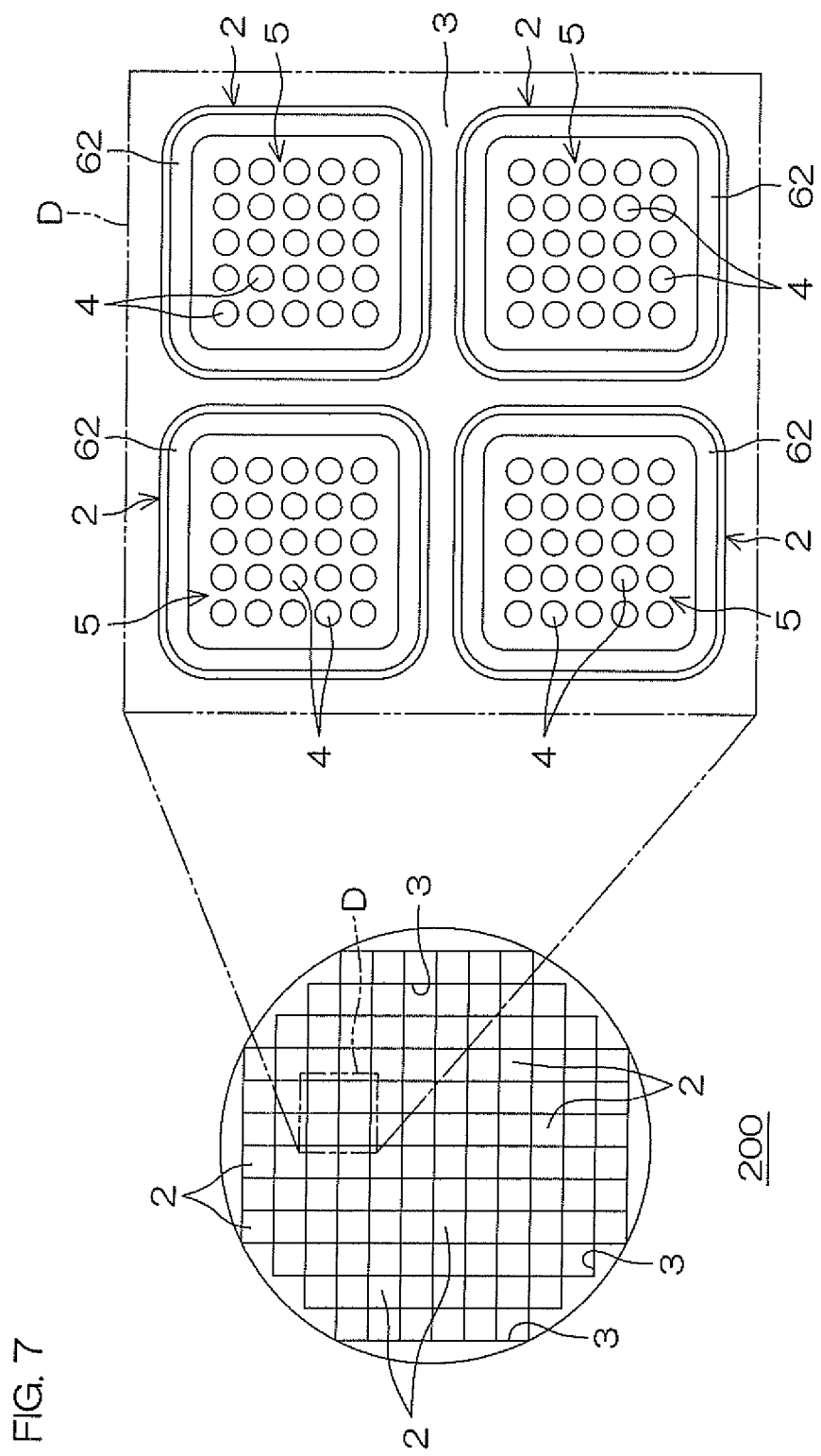

STACKED CHIPS ELECTRICALLY CONNECTED BY A PLURALITY OF JUNCTURE PORTIONS

CROSS-REFERENCE TO RELATED APPLICATIONS

This application corresponds to Japanese Patent Application No. 2013-238223 filed in the Japan Patent Office on Nov. 18, 2013, the disclosure of which is incorporated herein by reference in its entirety.

FIELD OF THE INVENTION

The present invention relates to a semiconductor device and a semiconductor device production method.

BACKGROUND ART

Patent Document 1 (JP-2011-71441A) discloses a stacked wafer structure which includes semiconductor wafers each including a plurality of semiconductor chips and stacked one on another. The stacked semiconductor wafers are connected to each other via bumps and silicon through-vias provided in the respective semiconductor wafers. The stacked wafer structure is cut along predetermined dicing lines defined between the semiconductor chips to be thereby divided into the individual semiconductor chips.

BRIEF SUMMARY OF THE INVENTION

In a semiconductor device production method by which the semiconductor chips are combined together through bumps and via-electrodes as disclosed in Patent Document 1, however, the connection strength at a juncture interface between the semiconductor chips is dependent upon the bumps and the via-electrodes. This makes it difficult to provide a uniform connection strength at the juncture interface between the semiconductor chips.

If the stacked semiconductor wafers are connected to each other with a non-uniform connection strength at their juncture interface, the semiconductor chips problematically suffer from partial separation at their juncture interface or breakage of surfaces thereof due to stresses occurring in the steps of polishing the semiconductor wafers, forming via-electrodes in the semiconductor wafers, and cutting the semiconductor wafers. This problem may reduce the processing yield and, therefore, is desirably solved.

The present invention provides a semiconductor device which has a structure including a plurality of semiconductor chips stacked one on another and connected to each other with a highly uniform connection strength at their juncture interface and ensures an improved processing yield, and provides a production method for the semiconductor device.

BRIEF DESCRIPTION OF THE DRAWINGS

FIGS. 4A to 4J are sectional views for explaining an exemplary production process for the semiconductor device shown in FIG. 3.

FIGS. 6A and 6B are sectional views for explaining an exemplary production process for the semiconductor device shown in FIG. 5.

FIG. 7 is a schematic plan view illustrating a semiconductor wafer according to a third embodiment of the present invention.

DETAILED DESCRIPTION OF THE INVENTION

Figure 1:
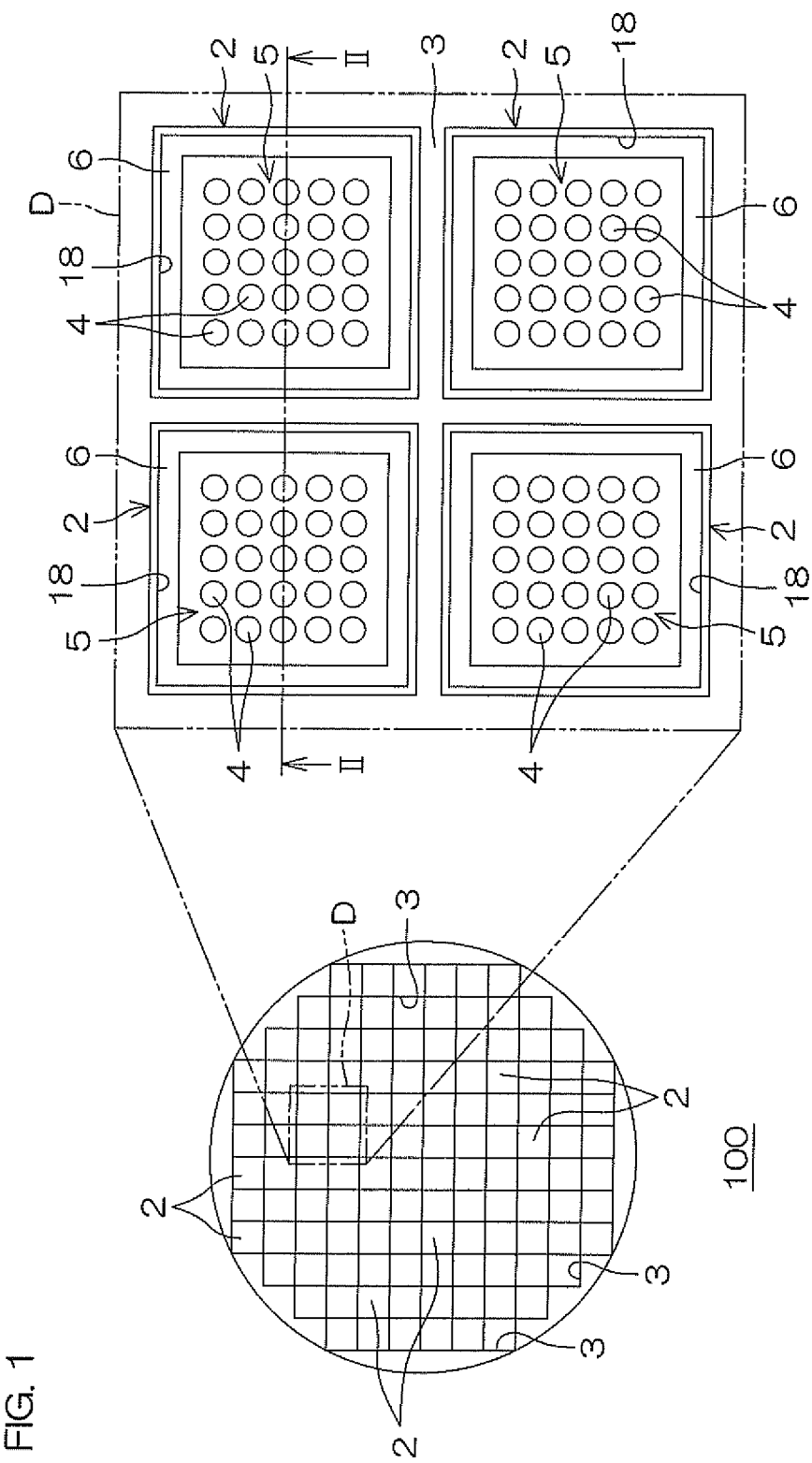
FIG. 1 is a schematic plan view illustrating a semiconductor wafer according to a first embodiment of the present invention.

According to one embodiment of the present invention, there is provided a semiconductor device, which includes: a first semiconductor chip; a second semiconductor chip having a front surface opposed to a front surface of the first semiconductor chip; a first electrode region including a first electrode provided between the first semiconductor chip and the second semiconductor chip to electrically connect the first semiconductor chip to the second semiconductor chip; and a juncture portion provided between the first semiconductor chip and the second semiconductor chip as surrounding the first electrode region to connect the first semiconductor chip to the second semiconductor chip.

With this arrangement, the first semiconductor chip and the second semiconductor chip are connected to each other via the first electrode as well as via the juncture portion. That is, the connection strength at a juncture interface between the first semiconductor chip and the second semiconductor chip is not dependent only upon the first electrode. This effectively enhances the uniformity of the connection strength at the juncture interface between the first semiconductor chip and the second semiconductor chip. As a result, the semiconductor device is insusceptible to the stresses occurring during the semiconductor device production process.

With this arrangement, the juncture portion surrounds the first electrode region and, therefore, the first electrode (first electrode region) can be sealed with the juncture portion. As a result, the moisture resistance of the semiconductor device can be effectively improved.

According to another embodiment of the present invention, the first electrode includes a first bump provided on the front surface of the first semiconductor chip and a second bump provided on the front surface of the second semiconductor chip to be electrically connected to the first bump, and the juncture portion includes a first juncture portion provided on the front surface of the first semiconductor chip and a second juncture portion provided on the front surface of the second semiconductor chip to be connected to the first juncture portion.

According to further another embodiment of the present invention, the semiconductor device further includes a first insulation layer provided on the front surface of the first semiconductor chip and a second insulation layer provided on the front surface of the second semiconductor chip. The first bump and the first juncture portion extend thicknesswise through the first insulation layer so as to be flush with a surface of the first insulation layer. The second bump and the second juncture portion extend thicknesswise through the second insulation layer so as to be flush with a surface of the second insulation layer.

With this arrangement, the first semiconductor chip and the second semiconductor chip are intimately combined with each other without any gap at their juncture interface. In other words, an intimately combining layer can be formed between the first semiconductor chip and the second semiconductor chip without any gap. This effectively enhances the uniformity of the connection strength at the juncture interface between the first semiconductor chip and the second semiconductor chip.

According to still another embodiment of the present invention, the first semiconductor chip and the second semiconductor chip each include a semiconductor element, and the juncture portion is electrically isolated from the semiconductor elements of the first and second semiconductor chips.

According to further another embodiment of the present invention, the semiconductor device further includes a via-electrode region including a via-electrode extending thicknesswise from a back surface of the second semiconductor chip to be electrically connected to the first electrode.

With this arrangement, the semiconductor device has a structure insusceptible to the stresses occurring during the production process. This makes it possible to properly electrically connect the first electrode to the via-electrode while suppressing the partial separation of the first semiconductor chip and the second semiconductor chip.

According to still another embodiment of the present invention, the via-electrode and the first electrode have the same shape and are located in overlapping positions as seen in plan.

According to further another embodiment of the present invention, the semiconductor device further includes: a third semiconductor chip having a front surface opposed to the back surface of the second semiconductor chip; a second electrode region including a second electrode provided between the second semiconductor chip and the third semiconductor chip to electrically connect the second semiconductor chip to the third semiconductor chip; and a back side juncture portion provided between the back surface of the second semiconductor chip and the front surface of the third semiconductor chip as surrounding the second electrode region to connect the second semiconductor chip to the third semiconductor chip.

This arrangement can effectively enhance the uniformity of the connection strength at a juncture interface between the second semiconductor chip and the third semiconductor chip. Even if the third semiconductor chip is stacked on the back surface of the second semiconductor chip, therefore, the semiconductor device is insusceptible to the stresses occurring during the semiconductor device production process.

With this arrangement, the back side juncture portion surrounds the second electrode region, so that the second electrode (second electrode region) can be sealed with this juncture portion. As a result, the moisture resistance of the semiconductor device can be effectively improved.

According to still another embodiment of the present invention, the second electrode includes a first back side bump provided on the back surface of the second semiconductor chip to be combined integrally with the via-electrode and electrically connected to the via-electrode, and a second back side bump provided on the front surface of the third semiconductor chip to be electrically connected to the first back side bump. The back side juncture portion includes a first back side juncture portion provided on the back surface of the second semiconductor chip, and a second back side juncture portion provided on the front surface of the third semiconductor chip to be connected to the first back side juncture portion.

According to further another embodiment of the present invention, the semiconductor device further includes a buried juncture portion extending thicknesswise from the back surface of the second semiconductor chip as surrounding the via-electrode region and connected to the back side juncture portion provided between the back surface of the second semiconductor chip and the front surface of the third semiconductor chip.

According to still another embodiment of the present invention, the second electrode is provided on the front surface of the third semiconductor chip, and the back side juncture portion is provided on the front surface of the third semiconductor chip.

This arrangement also provides the same effects as described above. Further, this arrangement obviates the need for providing the bump on the back surface of the second semiconductor chip, and the second electrode and the back side juncture portion provided on the third semiconductor chip can be respectively connected to the via-electrode and the buried juncture portion provided in the second semiconductor chip. In addition, the formation of the via-electrode and the formation of the buried juncture portion can be achieved in the same step, thereby simplifying the production process.

According to further another embodiment of the present invention, there is provided a semiconductor device production method, which includes the steps of: depositing an insulative material on a front surface of a semiconductor wafer having a plurality of element formation regions defined by a scribing region to form an insulation layer on the front surface of the semiconductor wafer; forming through-holes extending thicknesswise through the insulation layer in the respective element formation regions; forming trenches respectively surrounding the through-holes and extending thicknesswise in the insulation layer in the through-hole forming step; depositing an electrically conductive material in the through-holes and the trenches to form bumps and juncture portions each having a surface flush with a surface of the insulation layer; stacking two semiconductor wafers each formed with bumps and juncture portions in the bump/juncture portion forming steps so that the bumps and the juncture portions formed on a first one of the two semiconductor wafers are respectively connected to the bumps and the juncture portions formed on a second one of the two semiconductor wafers; and cutting the semiconductor wafers along the scribing region.

In the production method, the semiconductor wafers are connected to each other via the bumps as well as via the juncture portions, so that the uniformity of the connection strength at a juncture interface between the semiconductor wafers can be effectively enhanced. Further, the semiconductor wafers can be intimately combined with each other at their juncture interface without any gap. Thus, the resulting semiconductor device is insusceptible to stresses occurring during the semiconductor device production process. This makes it possible to effectively suppress the partial separation of the semiconductor wafers at their juncture interface and the breakage of the surfaces of the semiconductor wafers. As a result, the processing yield can be improved. Since the bumps are sealed with the juncture portions, the moisture resistance of the semiconductor devices can be improved.

According to still another embodiment of the present invention, the semiconductor device production method further includes the step of forming via-electrodes extending thicknesswise from a back surface of the second semiconductor wafer to be respectively electrically connected to the bumps formed on the front surface of the second semiconductor wafer before the semiconductor wafer cutting step after the semiconductor wafer stacking step.

This production method suppresses the partial separation of the semiconductor wafers at their juncture interface and the breakage of the surfaces of the semiconductor wafers which may otherwise be caused by stresses occurring during the formation of the via-electrodes, thereby ensuring proper connection between the bumps and the via-electrodes.

According to further another embodiment of the present invention, the semiconductor device production method further includes the steps of: depositing an insulative material on the back surface of the second semiconductor wafer to form a backside insulation layer on the back surface of the second semiconductor wafer before the semiconductor wafer cutting step after the via-electrode forming step; forming back side through-holes extending thicknesswise through the back side insulation layer; forming back side trenches respectively surrounding the back side through-holes in the back side through-hole forming step; and depositing an electrically conductive material in the back side through-holes and the back side trenches to form back side bumps and back side juncture portions each having a surface flush with a surface of the back side insulation layer.

This production method can suppress the partial separation of the semiconductor wafers at their juncture interface and the breakage of the surfaces of the semiconductor wafers which may otherwise be caused by stresses occurring during the formation of the back side bumps and the back side juncture portions, thereby ensuring proper formation of the back side bumps and the back side juncture portions.

According to still another embodiment of the present invention, the semiconductor device production method further includes the step of stacking a third semiconductor wafer formed with bumps and juncture portions in the bump/juncture portion forming steps on the second semiconductor wafer so that the bumps and the juncture portions formed on the third semiconductor wafer are respectively connected to the back side bumps and the back side juncture portions.

In this production method, even if another semiconductor wafer is additionally stacked on a back surface of either one of the two stacked semiconductor wafers, these semiconductor wafers can be intimately combined together without any gap. These semiconductor wafers can be connected to one another via the bumps (back side bumps) as well as via the juncture portions (back side juncture portions), so that the uniformity of the connection strengths at juncture interfaces between these semiconductor wafers can be effectively enhanced. As a result, the semiconductor device is insusceptible to the stresses occurring during the semiconductor device production process. This improves the processing yield.

With this arrangement, the bumps (back side bumps) are sealed with the juncture portions (back side juncture portions), so that the moisture resistance of the semiconductor device can be effectively improves.

According to further another embodiment of the present invention, the semiconductor device production method further includes the step of forming buried juncture portions extending thicknesswise from the back surface of the second semiconductor wafer and respectively surrounding the via-electrodes in the via-electrode forming step.

This production method can suppress the partial separation of the semiconductor wafers at their juncture interface and the breakage of the surfaces of the semiconductor wafers which may otherwise be caused by stresses occurring during the formation of the buried juncture portions, thereby ensuring proper formation of the buried juncture portions. In addition, the buried juncture portions are formed in the via-electrode forming step, so that the number of the production process steps is not increased.

According to still another embodiment of the present invention, the semiconductor device production method further includes the step of stacking a third semiconductor wafer formed with bumps and juncture portions in the bump/juncture portion forming steps on the second semiconductor wafer so that the bumps and the juncture portions formed on the third semiconductor wafer are respectively connected to the via-electrodes and the buried juncture portions.

Where the buried juncture portions are formed in the back surface of the semiconductor wafer in the production method, there is no need to form the bumps on the back surface of the semiconductor wafer. Therefore, another semiconductor wafer formed with bumps and juncture portions in the bump/juncture portion forming steps can be stacked as it is on the back surface of the semiconductor wafer. This simplifies the production process.

Embodiments of the present invention will hereinafter be described in detail with reference to the attached drawings. The construction of semiconductor wafers 100 to be used for production of a semiconductor device 1 will be first described with reference to FIGS. 1 and 2, and then the construction of the semiconductor device 1 will be described with reference to FIG. 3.

<Semiconductor Wafer>

Figure 2:
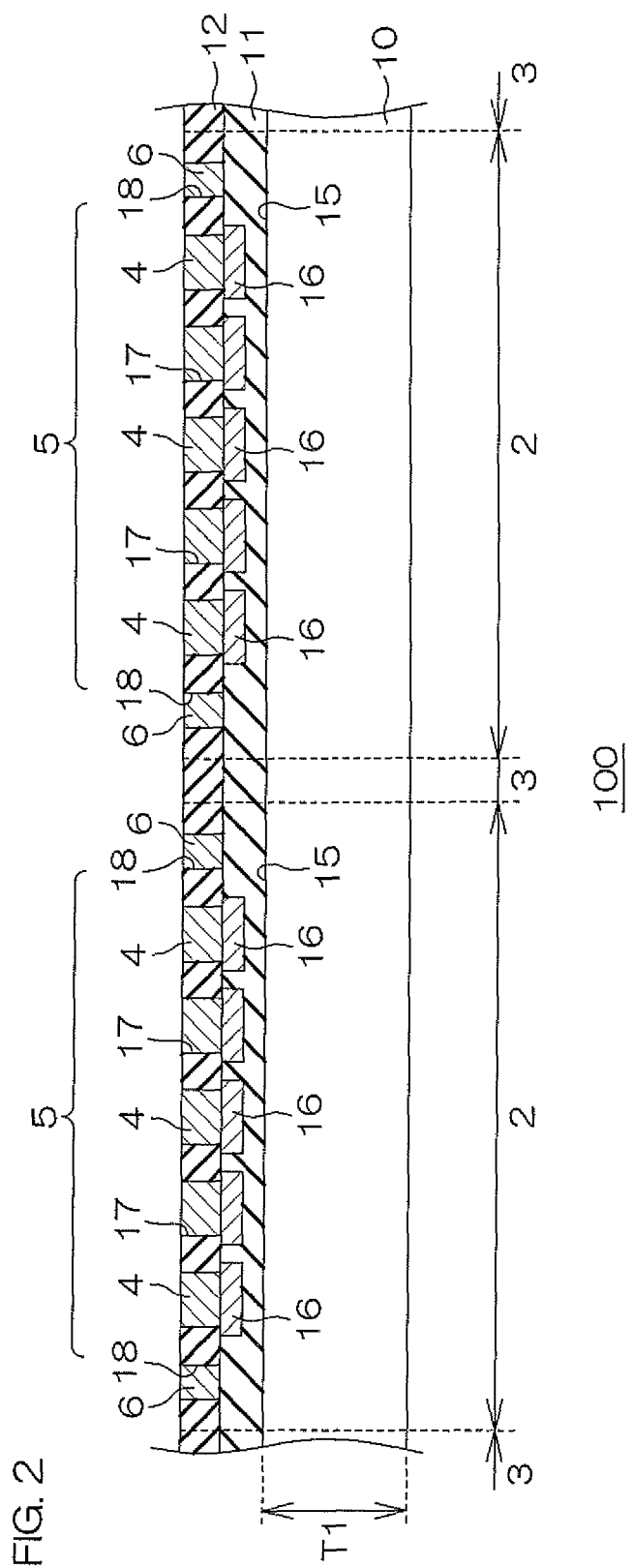
FIG. 2 is a sectional view taken along a sectional plane II-II in FIG. 1.

FIG. 1 is a schematic plan view illustrating a semiconductor wafer 100 according to a first embodiment of the present invention. FIG. 2 is a sectional view taken along a sectional plane II-II in FIG. 1. In FIG. 1, a region D of the semiconductor wafer 100 (a region enclosed by a two-dot-and-dash line) including four element formation regions 2 is illustrated on an enlarged scale.

As shown in FIG. 2, the semiconductor wafer 100 includes a semiconductor substrate (silicon substrate) 10, a wiring layer 11 provided on the semiconductor substrate 10, and an insulation layer 12 provided on the wiring layer 11. A plurality of element formation regions 2 and a scribing region 3 defining the element formation regions 2 are defined on the semiconductor substrate 10.

As shown in FIG. 1, the element formation regions 2 each have a rectangular shape as seen in plan, and are arranged in spaced relation in a row direction and in a column direction. That is, the element formation regions 2 are provided in a matrix array.

The scribing region 3 is a region along which a dicing operation is performed with the use of a dicing blade. The scribing region 3 has a mesh-like shape to define the element formation regions 2 as shown in FIG. 1. The semiconductor wafer 100 is diced along the scribing region 3, whereby the element formation regions are separated from each other to provide semiconductor chips.

In the element formation regions 2 of the semiconductor substrate 10, semiconductor elements and passive elements such as transistors, MOSFETs, resistors and capacitors are selectively provided. A front surface of the semiconductor substrate 10 formed selectively with the semiconductor elements, the passive elements and the like is hereinafter referred to as an active surface 15 of the semiconductor substrate 10. The semiconductor substrate 10 has a thickness T1 of, for example, 700 μm to 800 μm.

The wiring layer 11 has, for example, a multi-level wiring structure, and includes top metal portions 16 as uppermost wirings. In FIG. 2, wirings below the uppermost wirings are not shown. The top metal portions 16 are provided in the element formation regions 2, and exposed in the outermost surface of the wiring layer 11. The top metal portions 16 are provided on the active surface 15 of the semiconductor substrate 10 and electrically connected to the semiconductor elements and the like.

The insulation layer 12 is provided on the wiring layer 11 as covering the top metal portions 16. The insulation layer 12 has a thickness of, for example, 2 μm to 10 μm. The insulation layer 12 is preferably an organic insulation layer composed of an organic insulative material such as containing a polyimide, a carbon polyimide or the like, but may be made of an insulative material such as silicon oxide or silicon nitride. In this embodiment, the insulation layer 12 has a single layer structure, but may have a multi-layer structure. An electrode region 5 (first electrode region in the present invention) and a dummy ring 6 (juncture portion in the present invention) surrounding the electrode region 5 are provided in the insulation layer 12 in each of the element formation regions 2.

A plurality of bump electrodes 4 (first electrode in the present invention) are provided in the electrode region 5. In this embodiment, as shown in FIG. 1, the bump electrodes 4 each have a round shape as seen in plan, and arranged in spaced relation in a row direction and in a column direction. That is, the bump electrodes 4 are provided in a matrix array in the electrode region 5.

As shown in FIG. 2, the bump electrodes 4 are each made of an electrically conductive material and buried in a through-hole 17, which extends thicknesswise through the insulation layer 12 to expose the top metal portion 16. The electrically conductive material for the bump electrodes 4 is deposited in the through-holes 17 so as to be flush with a surface of the insulation layer 12. That is, the bump electrodes 4 are electrically connected to the semiconductor elements and the like formed in the active surface 15 of the semiconductor substrate 10 via the top metal portions (wiring layer 11). Examples of the electrically conductive material for the bump electrodes 4 include Cu (copper), Au (gold) and Sn (tin).

On the other hand, the dummy ring 6 has a closed loop shape (in this embodiment, a rectangular loop shape as seen in plan) surrounding the electrode region 5 as shown in FIG. 1. The dummy ring 6 is composed of an electrically conductive material and buried in a trench 18. The trench 18 has a rectangular loop shape as seen in plan and extends through the insulation layer 12. The trench 18 has a bottom located on the wiring layer 11. The electrically conductive material for the dummy ring 6 is deposited in the trench 18 so as to be flush with the surface of the insulation layer 12. Examples of the electrically conductive material for the dummy ring 6 include Cu, Au and Sn.

Although the bottom of the dummy ring 6 is located on the wiring layer 11, the dummy ring 6 is not electrically connected to any of the top metal portions 16. That is, the dummy ring 6 is electrically isolated from the semiconductor elements and the like formed in the active surface 15 of the semiconductor substrate 10.

The semiconductor device 1 is produced by stacking such semiconductor wafers 100 one on another periodically with the front surfaces and/or the back surfaces of the semiconductor wafers 100 being opposed to each other, and cutting the resulting stacked wafer structure along the scribing region 3. The semiconductor elements, the passivation elements and the like to be formed in the respective element formation regions 2 of the semiconductor wafers 100 to be stacked may have different functions, or may have the same function.
<Semiconductor Device>

Figure 3:
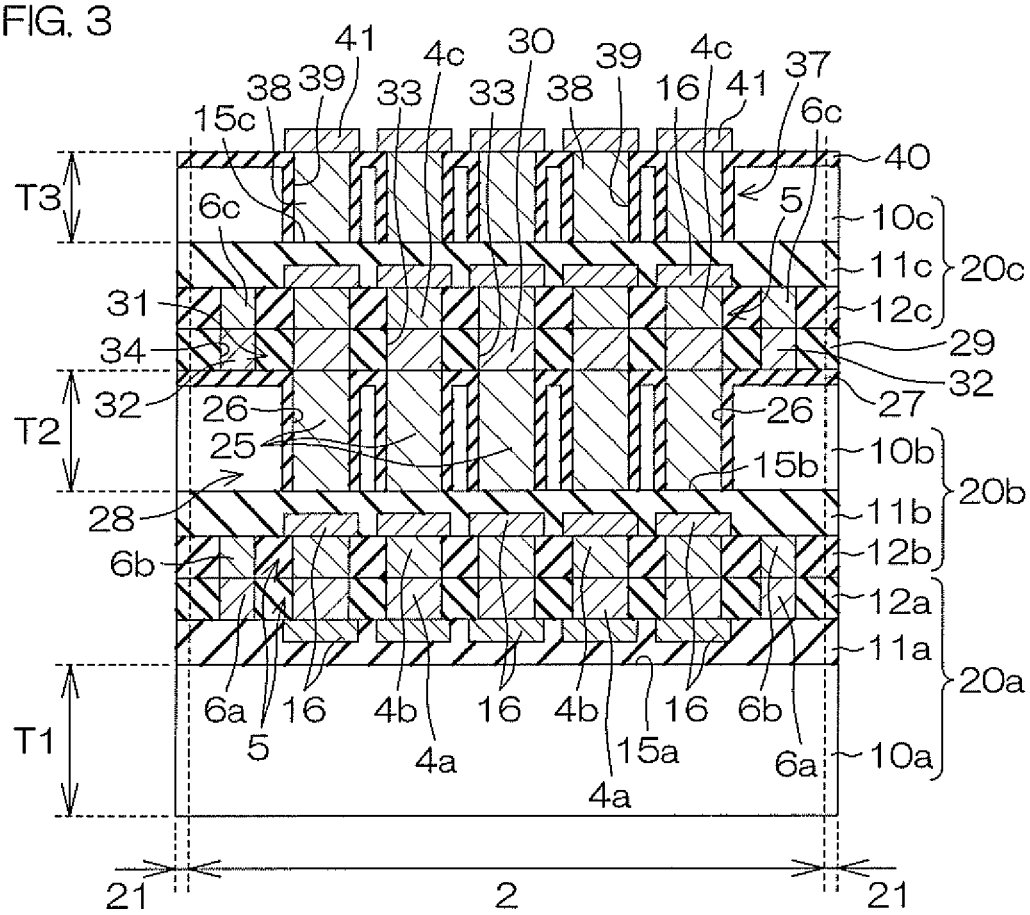
FIG. 3 is a schematic sectional view illustrating a semiconductor device according to the first embodiment of the present invention.

FIG. 3 is a schematic sectional view illustrating the semiconductor device 1 according to the first embodiment of the present invention.

In this embodiment, the semiconductor device 1 has a construction such that a plurality of semiconductor chips are stacked. In this embodiment, the plurality of semiconductor chips include three semiconductor chips (first to third semiconductor chips 20a, 20b, 20c) stacked one on another by way of example, but more than three semiconductor chips may be stacked.

As shown in FIG. 3, the semiconductor device 1 includes the first to third semiconductor chips 20a, 20b, 20c. An element formation region 2 and a marginal region 21 are defined in each of the first to third semiconductor chips 20a, 20b, 20c. The marginal region 21 is a part of the scribing region 3 remaining after the cutting with the dicing blade. Semiconductor elements and passive elements having different functions or semiconductor elements and passive elements having the same function may be provided in the element formation regions 2 of the first to third semiconductor chips 20a, 20b, 20c.

The first to third semiconductor chips 20a, 20b, 20c include first to third semiconductor substrates 10a, 10b, 10c, first to third wiring layers 11a, 11b, 11c provided on the first to third semiconductor substrates 10a, 10b, 10c, and first to third insulation layers 12a, 12b, 12c provided on the first to third wiring layers 11a, 11b, 11c, respectively. First to third bump electrodes 4a, 4b, 4c and first to third dummy rings 6a, 6b, 6c are provided in the first to third insulation layers 12a, 12b, 12c, respectively. The first to third bump electrodes 4a, 4b, 4c are connected to top metal portions 16 provided selectively in the first to third wiring layers 11a, 11b, 11c, respectively. Surfaces of the first to third semiconductor substrates 10a, 10b, 10c formed selectively with the semiconductor elements, the passive elements and the like are herein defined as first to third active surfaces 15a, 15b, 15c, respectively.

The first semiconductor chip 20a is disposed as a support base at the lowermost level with the first active surface 15a of the first semiconductor substrate 10a thereof facing up. The second semiconductor chip 20b is stacked on the first semiconductor chip 20a with the second active surface 15b of the second semiconductor substrate 10b opposed to the first active surface 15a of the first semiconductor chip 20a. The third semiconductor chip 20c is stacked on the second semiconductor chip 20b with the third active surface 15c of the third semiconductor substrate 10c opposed to a back surface of the second semiconductor chip 20b (i.e., a surface of the second semiconductor chip 20b opposite from the second active surface 15b).

The second semiconductor chip 20b is stacked on the first semiconductor chip 20a so that the second bump electrodes 4b thereof are respectively connected to the first bump electrodes 4a of the first semiconductor chip 20a and the second dummy ring 6b thereof is connected to the first dummy ring 6a of the first semiconductor chip 20a. That is, the first and second semiconductor chips 20a, 20b are electrically and mechanically connected to each other via the first and second bump electrodes 4a, 4b, and mechanically connected to each other via the first and second dummy rings 6a, 6b.

In other words, the first and second semiconductor chips 20a, 20b are connected to each other via columnar connection electrodes formed by combining the first bump electrodes 4a integrally with the second bump electrodes 4b and via a ring-shaped juncture portion formed by combining the first dummy ring 6a integrally with the second dummy ring 6b. An insulation layer formed by combining the first insulation layer 12a integrally with the second insulation layer 12b is provided between the first and second semiconductor chips 20a, 20b, so that the first and second semiconductor chips 20, 20b are intimately combined with each other at their juncture interface without any gap. That is, an intimately combining layer formed by the insulation layer, the connection electrodes extending through the insulation layer, and the juncture portion surrounding the connection electrodes is provided between the first and second semiconductor chips 20a, 20b without any gap.

The second semiconductor substrate 10b of the second semiconductor chip 20b is thinner than the first semiconductor substrate 10a of the first semiconductor chip 20a, and has a thickness T2 of, for example, 10 μm to 100 μm.

A first via-electrode region 28 (via-electrode region in the present invention) is defined in the second semiconductor substrate 10b. The first via-electrode region 28 includes a plurality of first via-electrodes (via-electrode in the present invention) electrically connected to the second wiring layer 11b. In this embodiment, the first via-electrodes 25 are respectively located at positions overlapping the second bump electrodes 4b and have the same shape as the second bump electrodes 4b as seen in plan by way of example. The first via-electrodes 25 are TSVs (Through-Silicon Vias).

The first via-electrodes 25 are composed of an electrically conductive material, and respectively buried in through-holes 26. The through-holes 26 extend thicknesswise through the second semiconductor substrate 10b, and each have a bottom located on the second wiring layer 11b of the second semiconductor substrate 10b. An insulation film 27 is provided on a back surface of the semiconductor substrate 10b including side surfaces of the through-holes 26. The insulation film 27 is, for example, a silicon oxide film. The first via-electrodes 25 of the electrically conductive material are respectively buried in the through-holes 26 with the intervention of portions of the insulation film 27 provided on the side surfaces of the through-holes 26. Examples of the electrically conductive material for the first via-electrodes 25 include Cu, Au and Sn.

The first via-electrodes 25 are not necessarily required to be respectively located at the positions overlapping the second bump electrodes 4b as seen in plan, but may be located at positions different from those of the second bump electrodes 4b and connected to the second bump electrodes 4b, for example, via routing wirings or the like (not shown). The first via-electrodes 25 may be configured and dimensioned differently from the second bump electrodes 4b.

A back side insulation layer 29, a back side electrode region 31 (back side electrode region in the present invention) and a back side dummy ring 32 (back side juncture portion in the present invention) are provided on a back surface of the second semiconductor substrate 10b.

The back side insulation layer 29 is provided on the back surface of the second semiconductor substrate 10b as covering the first via-electrodes 25. The back side insulation layer 29 has a thickness of, for example, 2 μm to 10 μm. The back side insulation layer 29 is preferably an organic insulation layer composed of an organic insulative material such as containing a polyimide or a carbon polyimide, but may be made of an insulative material such as silicon oxide or silicon nitride.

The back side electrode region 31 includes a plurality of back side bump electrodes 30 (back side electrode in the present invention) to be respectively electrically connected to the first via-electrodes 25. In this embodiment, the back side bump electrodes 30 are respectively located at positions overlapping the first via-electrodes 25 and have the same shape as the first via-electrodes 25 as seen in plan by way of example.

The back side bump electrodes 30 are composed of an electrically conductive material, and respectively buried in through-holes 33. The through-holes 33 extend thicknesswise through the back side insulation layer 29 so as to expose the first via-electrodes 25. The electrically conductive material for the back side bump electrodes 30 is deposited in the through-holes 33 so as to be flush with a surface of the back side insulation layer 29. The back side bump electrodes 30 are respectively combined integrally with the first via-electrodes 25 to be electrically connected to the first via-electrodes 25. That is, the back side bump electrodes 30 are electrically connected to the first and second semiconductor chips 20a, 20b via the first via-electrodes 25. Examples of the electrically conductive material for the back side bump electrodes 30 include Cu, Au and Sn.

The back side bump electrodes 30 are not necessarily required to be respectively located at the positions overlapping the first via-electrodes 25 as seen in plan, but may be located at positions different from those of the first via-electrodes 25 and connected to the first via-electrodes 25, for example, via routing wirings or the like (not shown). The back side bump electrodes 30 may be configured and dimensioned differently from the first via-electrodes 25.

The back side dummy ring 32 is composed of an electrically conductive material, and buried in a back side trench 34. In this embodiment, the back side dummy ring 32 is located at the same position and has the same shape as the first and second dummy rings 6a, 6b as seen in plan. The back side trench 34 extends downward in the back side insulation layer 29, and has a rectangular loop shape as seen in plan. The back side trench 34 extends thicknesswise through the back side insulation layer 29, and has a bottom located on the insulation film 27 provided on the back surface of the second semiconductor substrate 10b.

The electrically conductive material for the back side dummy ring 32 is deposited in the back side trench 34 so as to be flush with the surface of the back side insulation layer 29. That is, the back side dummy ring 32 is electrically isolated from the first and second semiconductor chips 20a, 20b. The back side dummy ring 32 is preferably made of the same electrically conductive material as the back side bump electrodes 30.

The third semiconductor chip 20c is stacked on the back surface of the second semiconductor substrate 10b so that the third bump electrodes 4c are respectively connected to the back side bump electrodes 30 and the third dummy ring 6c is connected to the back side dummy ring 32. That is, the second and third semiconductor chips 20b, 20c are electrically and mechanically connected to each other via the third bump electrodes 4c and the back side bump electrode 30, and mechanically connected to each other via the third dummy ring 6c and the back side dummy ring 32.

In other words, the second and third semiconductor chips 20b, 20c are connected to each other via columnar connection electrodes formed by combining the third bump electrodes 4c integrally with the back side bump electrodes 30 and via a ring-shaped juncture portion formed by combining the third dummy ring 6c integrally with the back side dummy ring 32. An insulation layer formed by combining the third insulation layer 12c integrally with the back side insulation layer 29 is provided between the second and third semiconductor chips 20b, 20c, so that the second and third semiconductor chips 20b, 20c are intimately combined with each other at their juncture interface without any gap. That is, an intimately combining layer formed by the insulation layer, the connection electrodes extending through the insulation layer and the juncture portion surrounding the connection electrodes is provided between the second and third semiconductor chips 20b, 20c without any gap.

Like the second semiconductor substrate 10b, the third semiconductor substrate 10c of the third semiconductor chip 20c is thinner than the first semiconductor substrate 10a of the first semiconductor chip 20a, and has a thickness T3 of, for example, 10 μm to 100 μm.

A second via-electrode region 37 is defined in the third semiconductor substrate 10c. The second via-electrode region 37 includes a plurality of second via-electrodes 38 electrically connected to the third wiring layer 11c of the third semiconductor chip 20c. In this embodiment, the second via-electrodes 38 are respectively located at positions overlapping the third bump electrodes 4c and have the same shape as the third bump electrodes 4c as seen in plan by way of example. Like the first via-electrodes 25, the second via-electrodes 38 are TSVs.

The second via-electrodes 38 are composed of an electrically conductive material, and respectively buried in through-holes 39. The through-holes 39 extend thicknesswise through the third semiconductor substrate 10c, and each have a bottom located on the third wiring layer 11c of the third semiconductor chip 20c. An insulation film 40 is provided on a back surface of the third semiconductor substrate 10c including side surfaces of the through-holes 39. The insulation film 40 is, for example, a silicon oxide film. The second via-electrodes 38 of the electrically conductive material are respectively buried in the through-holes 39 with the intervention of portions of the insulation film 40 formed on the side surfaces of the through-holes 39. Examples of the electrically conductive material for the second via-electrodes 38 include Cu, Au and Sn.

The second via-electrodes 38 are not necessarily required to be respectively located at the positions overlapping the third bump electrodes 4c as seen in plan, but may be located at positions different from those of the third bump electrodes 4c and connected to the third bump electrodes 4c, for example, via routing wirings (not shown). The second via-electrodes 38 may be dimensioned and configured differently from the third bump electrodes 4c.

Front side bump electrodes 41 are provided on the back surface of the third semiconductor substrate 10c so as to cover the second via-electrodes 38. Exemplary electrically conductive materials for the front side bump electrodes 41 include Cu, Au and Sn. The front side bump electrodes 41 function as external terminals of the semiconductor device 1. When electric power is supplied to the front side bump electrodes 41, the electric power is supplied to the first to third semiconductor chips 20a, 20b, 20c.

In the semiconductor device 1, as described above, the first and second semiconductor chips 20a, 20b are connected to each other via the first and second bump electrodes 4a, 4b as well as via the first and second dummy rings 6a, 6b. That is, the connection strength at the juncture interface between the first and second semiconductor chips 20a, 20b is not dependent only upon the connection between the first and second bump electrodes 4a, 4b.

Similarly, the second and third semiconductor chips 20b, 20c are connected to each other via the back side bump electrodes 30 and the third bump electrodes 4c as well as via the back side dummy ring 32 and the third dummy ring 6c. That is, the connection strength at the juncture interface between the second and third semiconductor chips 20b, 20c is not dependent only upon the connection between the back side bump electrodes 30 and the third bump electrodes 4c.

Thus, the uniformity of the connection strength at the juncture interface between the first and second semiconductor chips 20a, 20b and the uniformity of the connection strength at the juncture interface between the second and third semiconductor chips 20b, 20c can be further enhanced. Therefore, the semiconductor device is insusceptible to stresses occurring during the semiconductor device production process.

In the semiconductor device 1, the first to third bump electrodes 4a, 4b, 4c and the back side bump electrodes 30 can be sealed with the first to third dummy rings 6a, 6b, 6c and the back side dummy ring 32. Therefore, the moisture resistance of the semiconductor device 1 can be further improved.

Next, a production process for the semiconductor device 1 will be described with reference to FIGS. 4A to 4J. FIGS. 4A to 4J are sectional views for explaining an exemplary production process for the semiconductor device 1 shown in FIG. 3.

For the production of the semiconductor device 1, as shown in FIG. 4A, element formation regions 2 and ascribing region 3 are first defined on a semiconductor substrate 10. Then, semiconductor elements and passive elements such as transistors, MOSFETs, resistors and capacitors are selectively formed in the element formation regions 2 of the semiconductor substrate 10. A surface of the semiconductor substrate 10 thus formed selectively with the semiconductor elements, the passive elements and the like is defined as an active surface 15.

In turn, as shown in FIG. 4B, a wiring layer 11 (for example, having a multi-level wiring structure) is formed on the semiconductor substrate 10 so as to be electrically connected to the semiconductor elements and the like formed in the active surface 15. At this time, top metal portions 16 are exposed as uppermost wirings in the outermost surface of the wiring layer 11 in the respective element formation regions 2 of the wiring layer 11.

Subsequently, as shown in FIG. 4C, an insulative material (e.g., a photosensitive polyimide) is deposited over the top metal portions 16 to form an insulation layer 12. In turn, the insulation layer 12 is exposed to light as having a pattern corresponding to through-holes 17 and dummy rings 6 by photolithography. Thus, the through-holes 17 and trenches 18 for formation of the dummy rings 6 are simultaneously formed (developed).

Then, a seed film (not shown) is formed as an underlying electrode film over the entire surface of the insulation layer 12 including the through-holes 17 and the trenches 18 by a sputtering method. In turn, as shown in FIG. 4D, an electrically conductive material is deposited over the insulation layer 12 to fill the through-holes 17 and the trenches 18 by plating after the formation of the seed film. Then, unnecessary portions of the seed film and the electrically conductive material deposited on the insulation layer 12 by the plating are removed by a CMP (Chemical Mechanical Polishing) method. Thus, a plurality of bump electrodes 4 (electrode regions 5) and the dummy rings 6 are formed as each having a surface flush with the surface of the insulation layer 12, whereby the semiconductor wafer 100 shown in FIGS. 1 and 2 is provided.

Then, as shown in FIG. 4E, three such semiconductor wafers 100 are prepared through the steps of FIGS. 4A to 4D. In the following description, a semiconductor wafer 100 located at the lowermost level is referred to as a first semiconductor wafer 100a, and semiconductor wafers 100 located sequentially on the first semiconductor wafer 100a are referred to as second and third semiconductor wafers 100b, 100c.

In turn, the second semiconductor wafer 100b is stacked on the first semiconductor wafer 100a. At this time, the second semiconductor wafer 100b is stacked on the first semiconductor wafer 100a, so that the first active surface 15a of the first semiconductor wafer 100a is opposed to the second active surface 15b of the second semiconductor wafer 100b. More specifically, the first and second semiconductor wafers 100a, 100b are stacked one on another, so that the first bump electrodes 4a, the first dummy rings 6a and the first insulation layer 12a are respectively connected to the second bump electrodes 4b, the second dummy rings 6b and the second insulation layer 12b. At this time, juncture surfaces of the first and second semiconductor wafers 100a, 100b are plasma-cleaned, and then heat-bonded to each other at a predetermined bonding temperature.

Subsequently, a back surface of the second semiconductor substrate 10b of the second semiconductor wafer 100b (i.e., a surface of the second semiconductor substrate 10b opposite from the second active surface 15b) is ground by means of a grindstone and then polished by a CMP method, whereby the thickness of the second semiconductor substrate 10b is reduced.

Figure 4F:
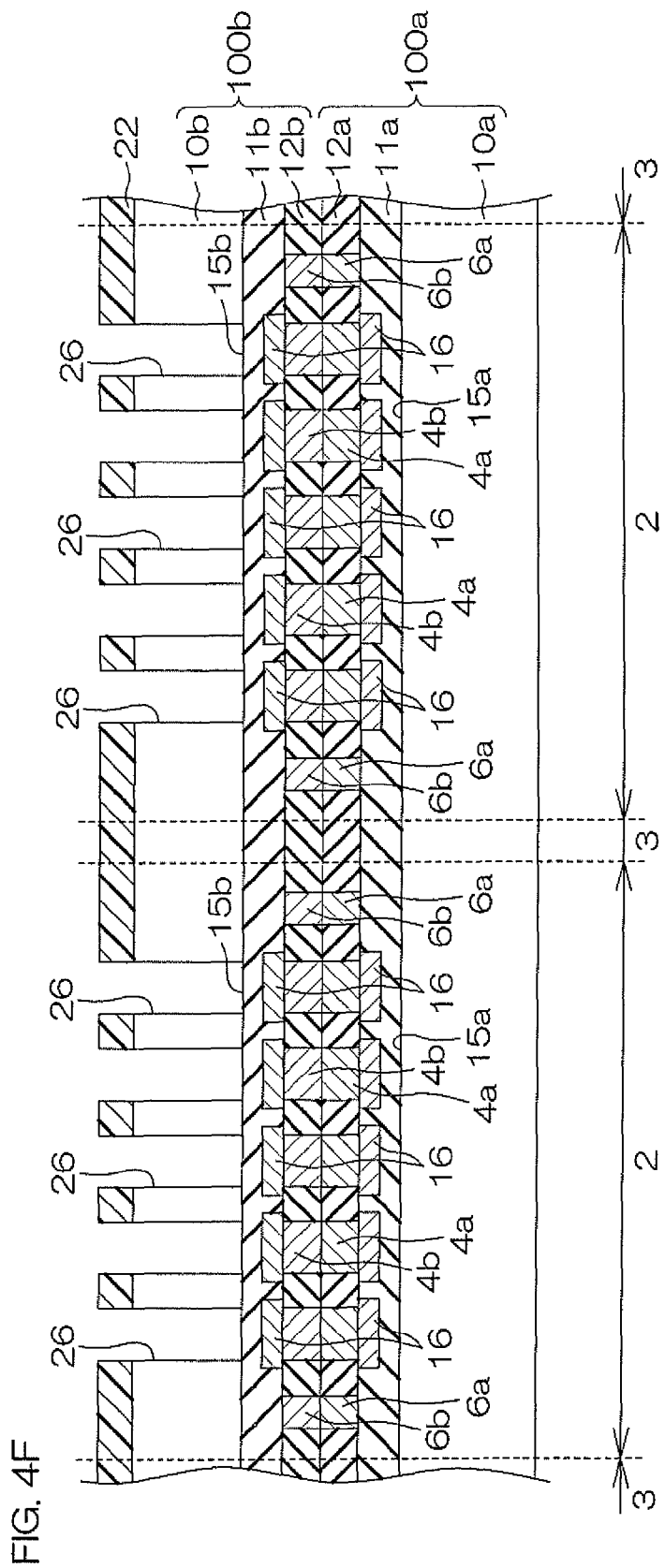

Then, as shown in FIG. 4F, a mask 22 having openings selectively in regions to be formed with first via-electrodes 25 is formed on the back surface of the second semiconductor substrate 10b. In turn, the back surface of the second semiconductor substrate 10b is etched with the use of the mask, whereby through-holes 26 are formed. After the formation of the through-holes 26, the mask 22 is removed.

Figure 4G:
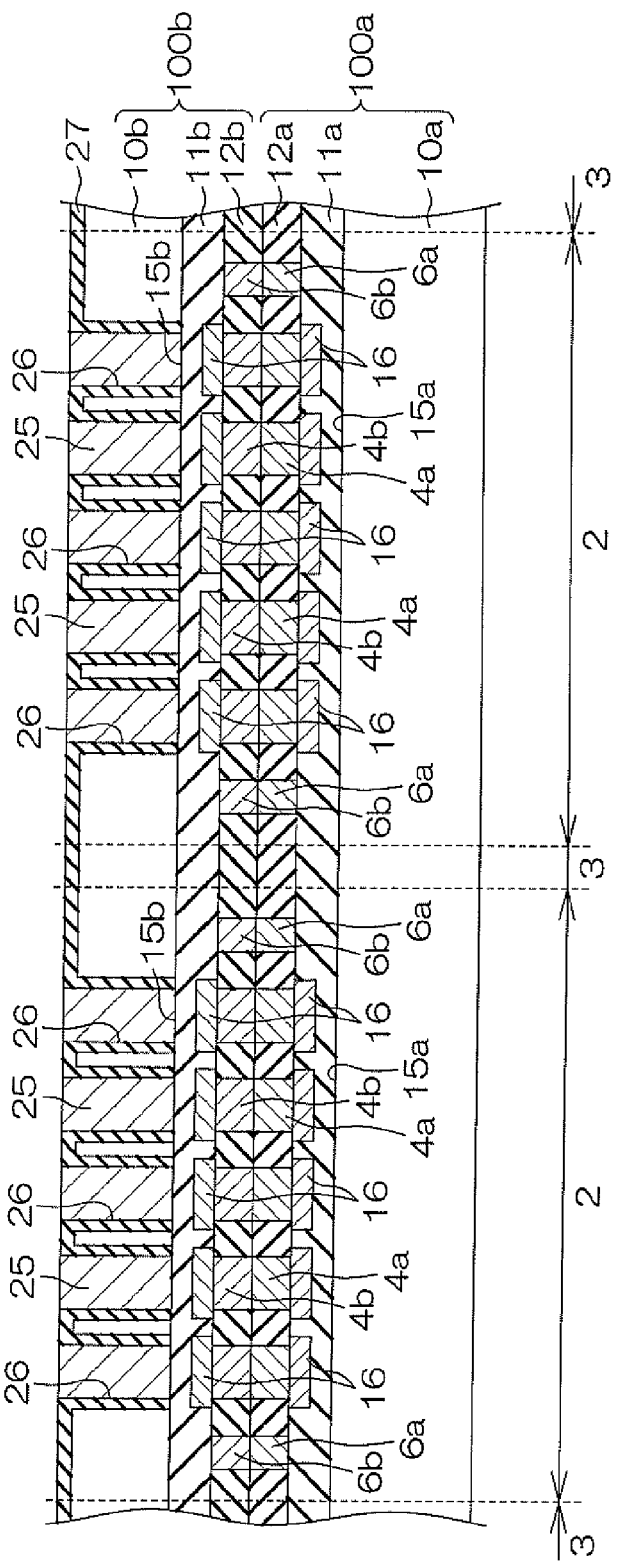

Subsequently, as shown in FIG. 4G, an insulation film 27 of a silicon oxide film is formed over the entire back surface of the second semiconductor substrate 10b including side surfaces of the through-holes 26 by a CVD method. Then, a seed film (not shown) is formed as an underlying electrode film over the entire surface of the insulation film 27 including the through-holes 26 by a sputtering method. In turn, an electrically conductive material is deposited over the insulation film 27 to fill the through-holes 26 by plating after the formation of the seed film. Then, an unnecessary portion of the electrically conductive material deposited on the insulation film 27 by the plating is removed. Thus, the first via-electrodes 25 are formed as each having a surface flush with the surface of the insulation film 27.

Figure 4H:
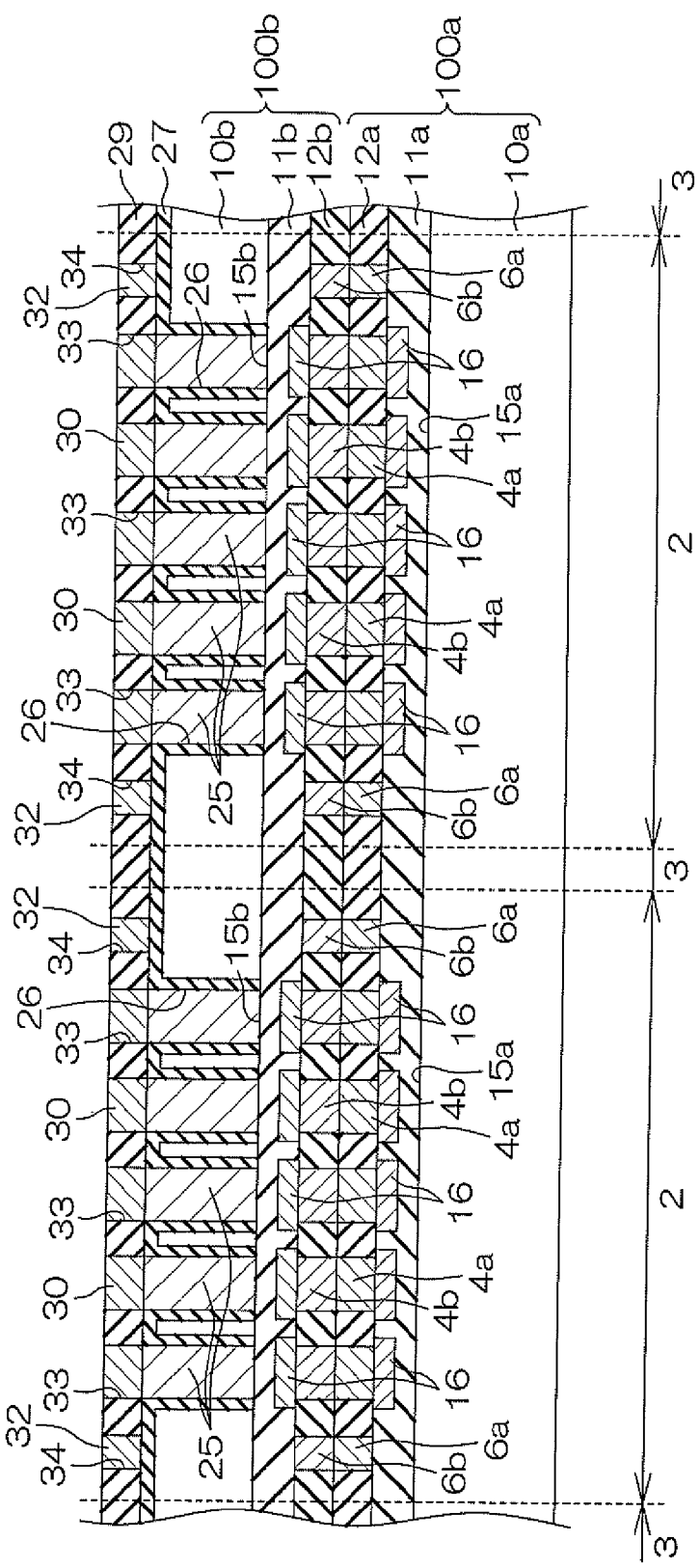

In turn, as shown in FIG. 4H, an insulative material (e.g., a photosensitive polyimide) is deposited over the back surface of the second semiconductor substrate 10b so as to cover the first via-electrodes 25, whereby a backside insulation layer 29 is formed. Then, the back side insulation layer 29 is exposed to light in a pattern corresponding to through-holes 33 and back side trenches 34 for formation of the back side dummy rings 32. Thus, the through-holes 33 and the back side trenches 34 for the formation of the back side dummy rings 32 are simultaneously formed (developed).

Subsequently, a seed film (not shown) is formed as an underlying electrode film over the entire surface of the back side insulation layer 29 including the through-holes 33 and the back side trenches 34 by a sputtering method. In turn, an electrically conductive material is deposited over the back side insulation layer 29 by plating so as to fill the through-holes 33 and the back side trenches 34 after the formation of the seed film. Then, unnecessary portions of the seed film and the electrically conductive material deposited on the back side insulation layer 29 by the plating are removed. Thus, the back side bump electrodes 30 and the back side dummy rings 32 are simultaneously formed as each having a surface flush with the surface of the back side insulation layer 29.

Figure 4I:
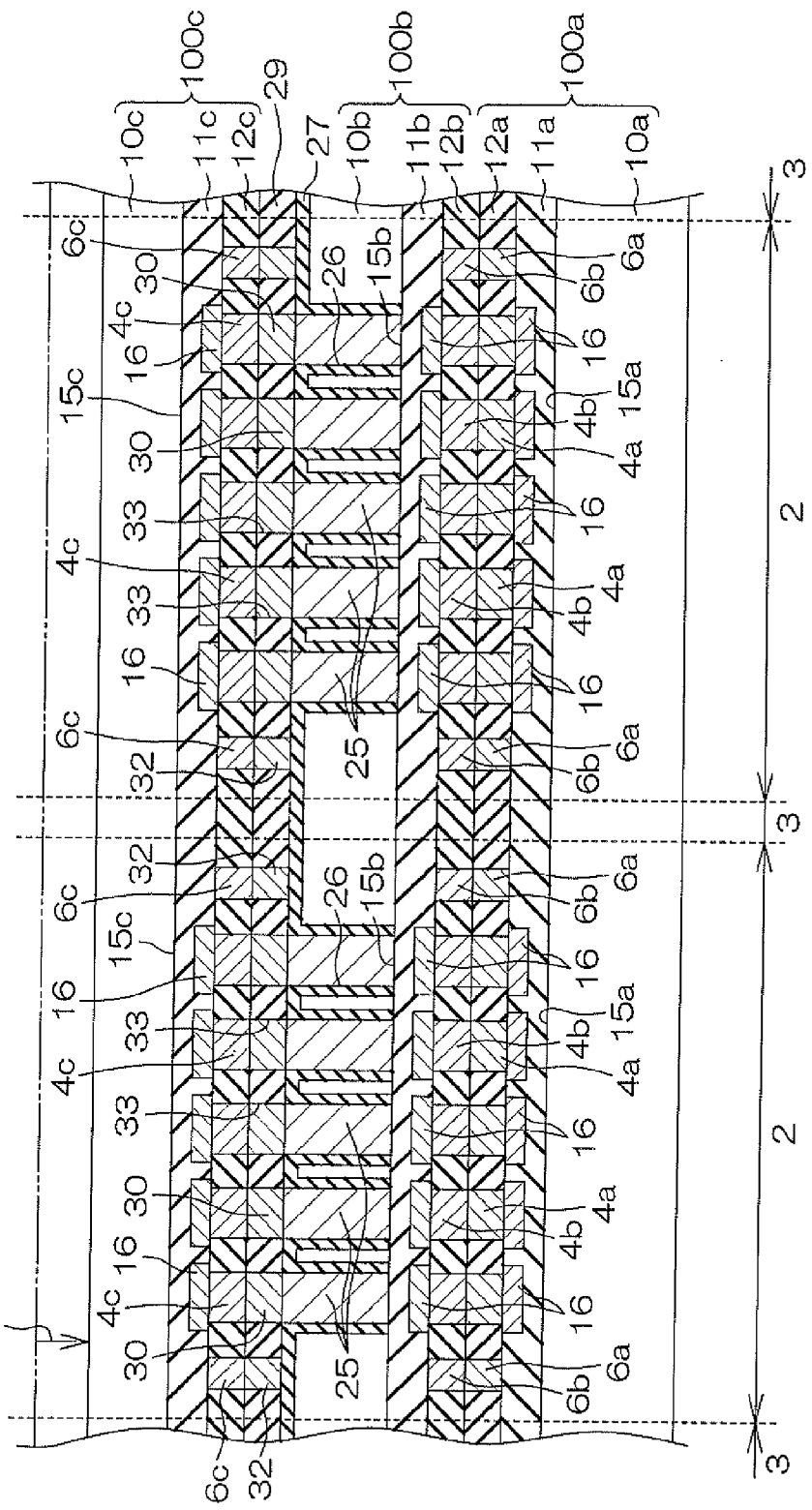

Then, as shown in FIG. 4I, the third semiconductor wafer 100c prepared through the steps shown in FIGS. 4A to 4D is stacked on the back surface of the second semiconductor wafer 100b. At this time, the third semiconductor wafer 100c is stacked on the second semiconductor wafer 100b, so that the back surface of the second semiconductor wafer 100b is opposed to the third active surface 15c of the third semiconductor wafer 100c. More specifically, the second semiconductor wafer 100b and the third semiconductor wafer 100c are stacked one on another, so that the third bump electrodes 4c, the third dummy rings 6c and the third insulation layer 12c are respectively connected to the back side bump electrodes 30, the back side dummy rings 32 and the back side insulation layer 29. At this time, juncture surfaces of the second and third semiconductor wafers 100b, 100c are plasma-cleaned, and then heat-bonded to each other at a predetermined bonding temperature.

Subsequently, a back surface (i.e., a surface opposite from the third active surface 15c) of the third semiconductor substrate 10c is ground by means of a grindstone and then polished by a CMP method, whereby the thickness of the third semiconductor substrate 10c is reduced.

Figure 4J:
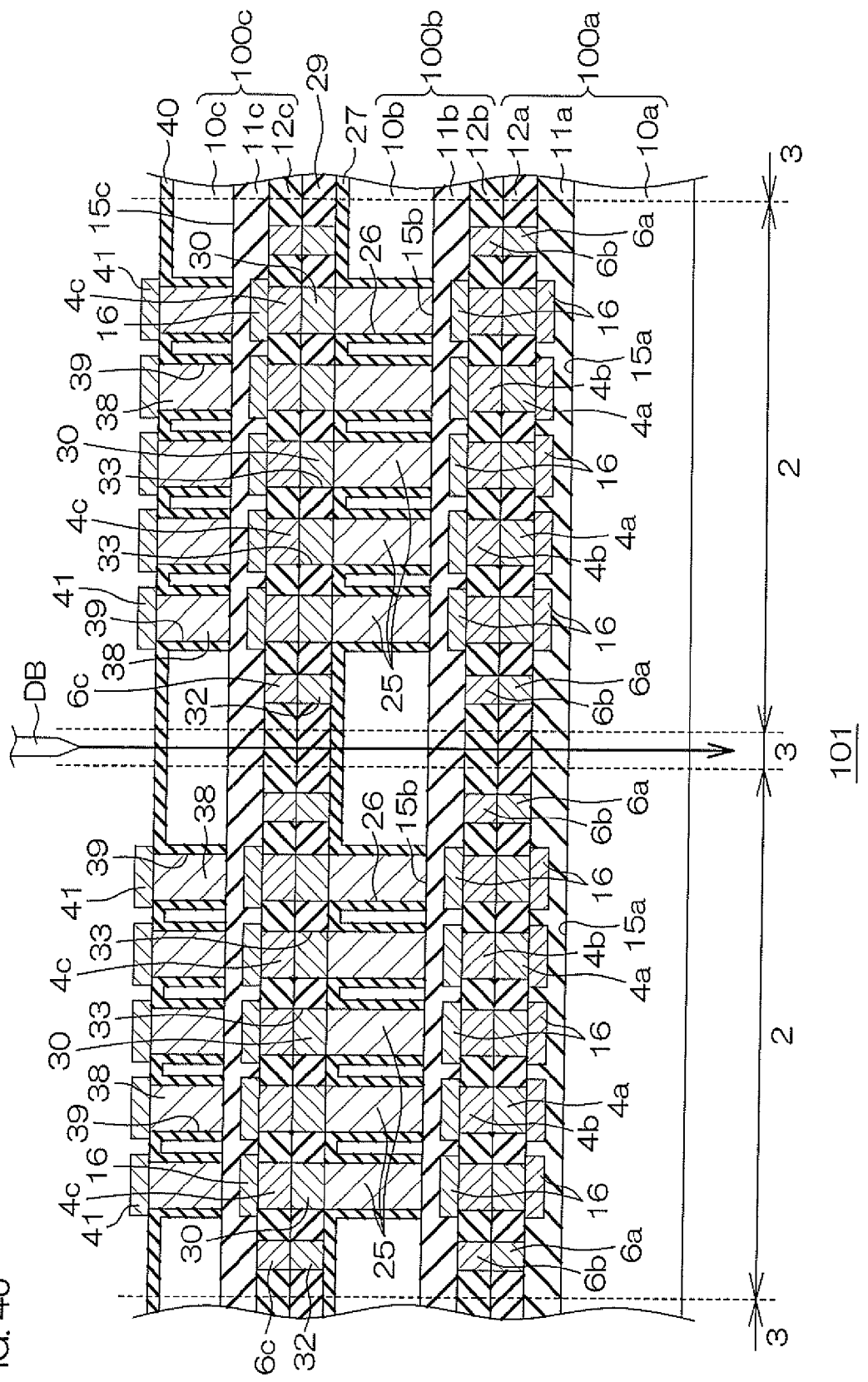

Then, as shown in FIG. 4J, second via-electrodes 38 are formed as extending from the back surface of the third semiconductor substrate 10c. For the formation of the second via-electrodes 38, a mask (not shown) having openings selectively in regions to be formed with the second via-electrodes 38 is formed on the back surface of the third semiconductor substrate 10c. In turn, the back surface of the third semiconductor substrate 10c is etched with the use of the mask, whereby through-holes 39 are formed. After the formation of the through-holes 39, the mask is removed.

Subsequently, an insulation film 40 of a silicon oxide film is formed over the entire back surface of the third semiconductor substrate 10c including side surfaces of the through-holes 39 by a CVD method. Then, a seed film (not shown) is formed as an underlying electrode film over the entire surface of the insulation film 40 including the through-holes 39 by a sputtering method. In turn, an electrically conductive material is deposited over the insulation film 40 to fill the through-holes 39 by plating after the formation of the seed film. Then, unnecessary portions of the seed film and the electrically conductive material deposited on the insulation film 40 by the plating are removed by a CMP method. Thus, the second via-electrodes 38 are formed as each having a surface flush with the surface of the insulation film 40.

In turn, an electrically conductive material is deposited selectively on the second via-electrodes 38 by plating, whereby front side bump electrodes 41 are formed. In this manner, a stacked wafer structure 101 is provided, which includes the first to third semiconductor wafers 100a, 100b, 100c stacked one on another.

Subsequently, the stacked wafer structure 101 is cut along the scribing region 3 by means of a dicing blade DB. Thus, semiconductor devices 1 are produced, which each have a substructure such that the first to third semiconductor chips 20a, 20b, 20c are stacked one on another as shown in FIG. 3.

In the production method for the semiconductor device 1, as described above, the first and second semiconductor wafers 100a, 100b are connected to each other via the first and second bump electrodes 4a, 4b as well as via the first and second dummy rings 6a, 6b in the step of FIG. 4E. At this time, the first and second semiconductor wafers 100a, 100b are intimately combined with each other at their juncture interface without any gap.

Thus, the uniformity of the connection strength at the juncture interface between the first and second semiconductor wafers 100a, 100b can be effectively enhanced. This effectively suppresses the partial separation of the first and second semiconductor wafers 100a, 100b at their juncture interface and the breakage of the surfaces of the first and second semiconductor wafers 100a, 100b which may otherwise be caused by stresses occurring when the second semiconductor substrate 10b is polished by the CMP.

In this production method, it is possible to effectively suppress the partial separation of the first and second semiconductor wafers 100a, 100b at their juncture interface and the breakage of the surfaces of the first and second semiconductor wafers 100a, 100b which may otherwise be caused by stresses occurring when the first via-electrodes 25, the back side bump electrodes 30 and the back side dummy rings 32 are formed in the steps of FIGS. 4F to 4H. Therefore, the first via-electrodes 25, the back side bump electrodes 30 and the back side dummy rings 32 can be advantageously formed.

In this production method, even if the third semiconductor wafer 100c is further stacked on the back surface of the second semiconductor wafer 100b in the step of FIG. 4I, the second and third semiconductor wafers 100b, 100c can be connected to each other via the third bump electrodes 4c and the back side bump electrodes 30 as well as via the third dummy rings 6c and the back side dummy rings 32. At this time, the second and third semiconductor wafers 100b, 100c are intimately combined with each other at their juncture interface without any gap.

Thus, the uniformity of the connection strength at the juncture interface between the second and third semiconductor wafers 100b, 100c can be effectively enhanced. This effectively suppresses the partial separation of the first to third semiconductor wafers 100a, 100b, 100c at their juncture interfaces and the breakage of the surfaces of the first to third semiconductor wafers 100a, 100b, 100c which may otherwise be caused by stresses occurring when the third semiconductor substrate 10c is polished by the CMP.

In this production method, it is possible to effectively suppress the partial separation of the first to third semiconductor wafers 100a, 100b, 100c at their juncture interfaces and the breakage of the surfaces of the first to third semiconductor wafers 100a, 100b, 100c which may otherwise be caused by stresses occurring when the second via-electrodes 38 and the front side bump electrodes 41 are formed in the step of FIG. 4J. Therefore, the second via-electrodes 38 and the front side bump electrodes 41 can be advantageously formed.

Further, it is possible to effectively suppress the partial separation of the first to third semiconductor wafers 100a, 100b, 100c at their juncture interfaces and the breakage of the surfaces of the first to third semiconductor wafers 100a, 100b, 100c which may otherwise be caused by stresses occurring when the stacked wafer structure 101 is cut by means of the dicing blade DB in the step of FIG. 4J. Therefore, the stacked wafer structure 101 can be advantageously cut.

In the production process for the semiconductor device 1, as described above, the uniformity of the connection strengths at the juncture interfaces between the first to third semiconductor wafers 100a, 100b, 100c can be effectively enhanced. This improves the processing yield. Further, the first to third bump electrodes 4a, 4b, 4c and the back side bump electrodes 30 can be effectively sealed by the first to third dummy rings 6a, 6b, 6c and the back side dummy rings 32, thereby further improving the moisture resistance of the semiconductor device 1.

Figure 5:
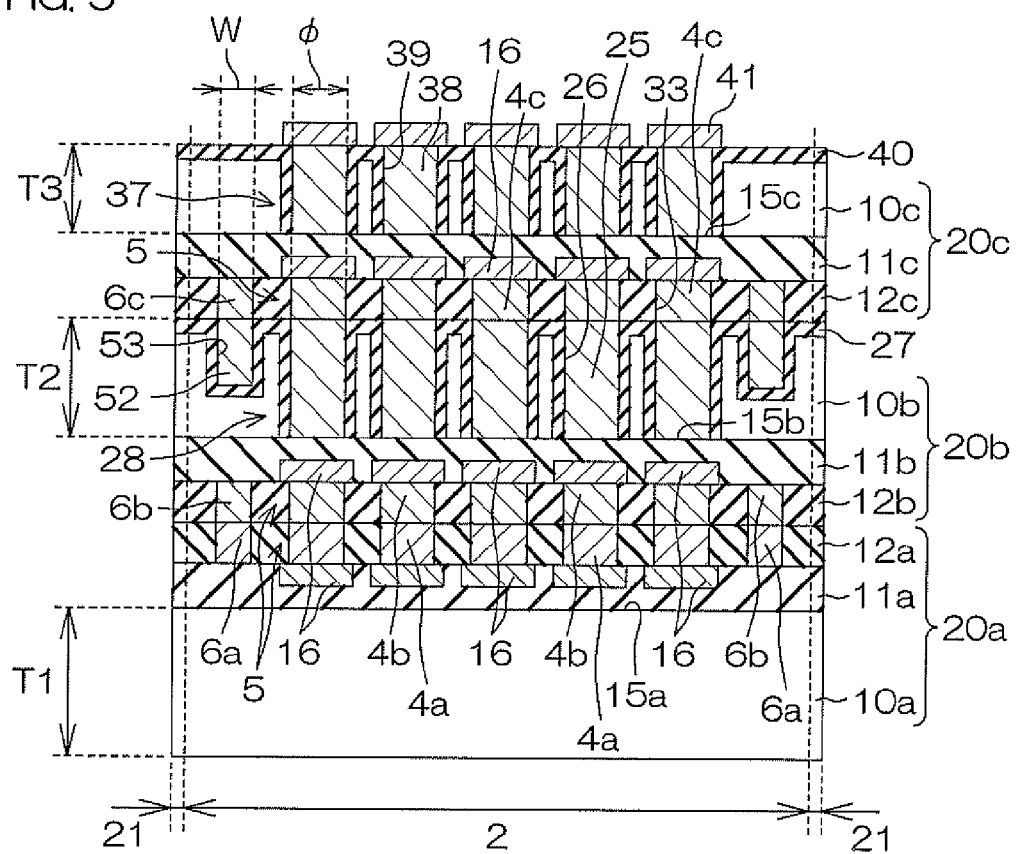
FIG. 5 is a schematic plan view illustrating a semiconductor device according to a second embodiment of the present invention.

FIG. 5 is a schematic plan view illustrating a semiconductor device 51 according to a second embodiment of the present invention. The semiconductor device 51 according to the second embodiment differs from the semiconductor device 1 according to the first embodiment in that the back side insulation layer 29, the back side bump electrodes 30 (back side electrode region 31) and the back side dummy ring 32 are not provided on the back surface of the second semiconductor chip 20b and that a buried dummy ring 52 is provided in the second semiconductor chip 20b. The other arrangement is the same as that of the semiconductor device 1 according to the first embodiment. In FIG. 5, components corresponding to those shown in FIGS. 1 to 4J are designated by the same reference characters as in FIGS. 1 to 4J, and duplicate description will be omitted.

As shown in FIG. 5, the buried dummy ring 52 (buried juncture portion in the present invention) is provided in the back surface of the second semiconductor chip 20b as surrounding the first via-electrode region 28.

The buried dummy ring 52 is located at the same position and has the same shape as the first and second dummy rings 6a, 6b as seen in plan. The buried dummy ring 52 is composed of an electrically conductive material, and buried in a backside trench 53. The back side trench 53 has a rectangular loop shape as seen in plan, and extends thicknesswise downward in the second semiconductor chip 20b. The back side trench 53 has a bottom located in a thicknesswise middle portion of the semiconductor chip 20b. That is, the bottom of the back side trench 53 is located between the front surface (second active surface 15b) and the back surface of the second semiconductor chip 20b. The back side trench 53 has a width W smaller than the diameter φ of the through-holes 26. An insulation film 27 is provided on the back surface of the second semiconductor substrate 10b including side surfaces of the back side trench 53.

The electrically conductive material for the buried dummy ring 52 is deposited in the back side trench 53 with the intervention of the insulation film 27 so as to be flush with the back surface of the second semiconductor chip 20b. The buried dummy ring 52 is electrically isolated from the first and second semiconductor chips 20a, 20b. The same electrically conductive material for the first via-electrodes 25 (i.e., Cu, Au, Sn or the like) is employed for the buried dummy ring 52.

This arrangement also provides the same effects as in the first embodiment. The semiconductor device 51 can be produced by performing the steps of FIGS. 6A and 6B instead of the steps of FIGS. 4F to 4G in the first embodiment.

Figure 6A:
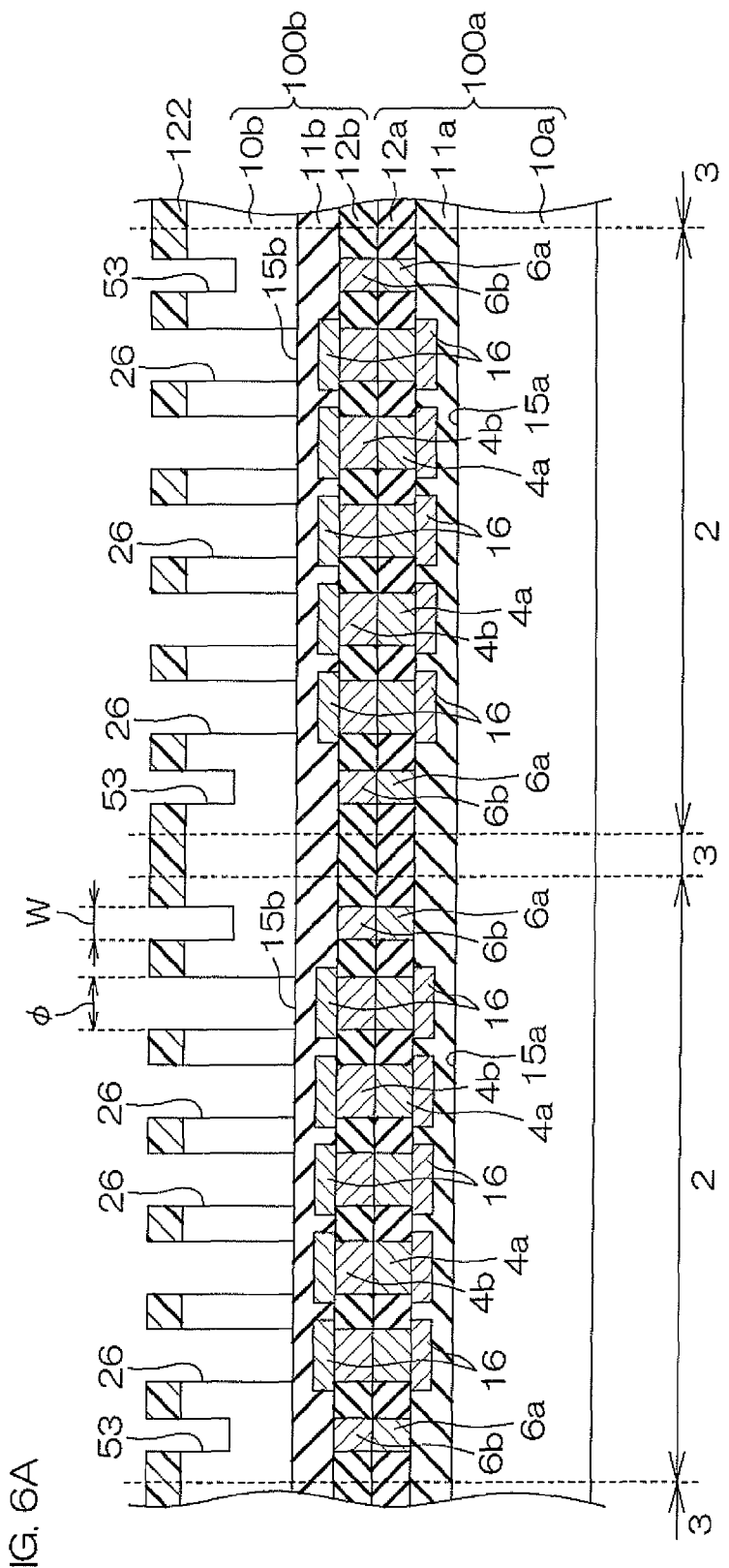

FIGS. 6A and 6B are sectional views for explaining an exemplary production process for the semiconductor device 51 shown in FIG. 5.

In the second embodiment, the thickness of the second semiconductor substrate 10b is reduced in the step of FIG. 4E, and then a mask 122 having openings selectively in regions to be formed with first via-electrodes 25 and buried dummy rings 52 is formed instead of the mask 22 on the back surface of the second semiconductor substrate 10b.

In turn, the back surface of the second semiconductor substrate 10b is etched with the use of the mask 122, whereby through-holes 26 and back side trenches 53 are formed. At this time, the layout of the mask 122 is designed so that the width W of the back side trenches 53 is smaller than the diameter φ of the through-holes 26. Therefore, the back side trenches 53 are more slowly formed than the through-holes 26 by etching. Therefore, when the bottoms of the through-holes 26 reach the wiring layer 11a, the bottoms of the back side trenches 53 are located in thicknesswise middle portions of the second semiconductor substrate 10b. Thus, the resulting back side trenches 53 each have a bottom located between the front surface (second active surface 15b) and the back surface of the second semiconductor chip 20b. After the formation of the through-holes 26 and the back side trenches 53, the mask 122 is removed.

Subsequently, as shown in FIG. 6B, an insulation film 27 of a silicon oxide film is formed over the entire back surface of the second semiconductor substrate 10b including side surfaces of the through-holes 26 and side surfaces of the back side trenches 53 by a CVD method. Then, a seed film (not shown) is formed as an underlying electrode film over the entire surface of the insulation film 27 including the through-holes 26 and the back side trenches 53 by a sputtering method. In turn, an electrically conductive material is deposited over the insulation film 27 to fill the through-holes 26 and the back side trenches 53 by plating after the formation of the seed layer. Then, an unnecessary portion of the electrically conductive material deposited on the insulation film 27 by the plating is removed by a CMP method. Thus, the first via-electrodes 25 and the buried dummy rings 52 are formed as each having a surface flush with a surface of the insulation film 27.

Then, a third semiconductor wafer 100*c* prepared through the steps of FIGS. 4A to 4D is stacked directly on the back surface of the second semiconductor wafer 100*b* as in the step of FIG. 4I. At this time, the third semiconductor wafer 100*c* is stacked on the second semiconductor wafer 100*b* so that the third active surface 15*c* is opposed to the back surface of the second semiconductor wafer 100*b*. More specifically, the second and third semiconductor wafers 100*b*, 100*c* are stacked one on another, so that the third bump electrodes 4*c*, the third dummy rings 6*c* and the third insulation layer 12*c* are respectively connected to the first via-electrodes 25, the buried dummy rings 52 and the insulation film 27 formed on the back surface of the second semiconductor substrate 10*b*. At this time, juncture surfaces of the second and third semiconductor wafers 100*b*, 100*c* are plasma-cleaned, and then heat-bonded to each other at a predetermined bonding temperature.

After the stacking of the third semiconductor wafer 100*c*, the step of FIG. 4J is performed. Thus, the semiconductor device 51 shown in FIG. 5 is produced.

In the production method for the semiconductor device 51, as described above, it is possible to suppress the partial separation of the first and second semiconductor wafers 100*a*, 100*b* at their juncture interface and the breakage of the surfaces of the first and second semiconductor wafers 100*a*, 100*b* which may otherwise be caused by stresses occurring when the buried dummy rings 52 are formed. As a result, the buried dummy rings 52 can be advantageously formed. In addition, the buried dummy rings 52 can be formed in the step of forming the first via-electrodes 25, so that the number of the production process steps is not increased.

In the production method for the semiconductor device 51, the third semiconductor wafer 100*c* can be stacked directly on the back surface of the second semiconductor wafer 100*b* without the need for forming the back side insulation layer 29, the back side bump electrodes 30 (back side electrode region 31) and the back side dummy rings 32 on the back surface of the second semiconductor wafer 100*b* unlike in the first embodiment. As a result, the production process can be simplified.

Further, it is possible to effectively suppress the partial separation of the first to third semiconductor wafers 100*a*, 100*b*, 100*c* at their juncture interfaces and the breakage of the surfaces of the first to third semiconductor wafers 100*a*, 100*b*, 100*c* which may otherwise be caused by stresses occurring when the stacked wafer structure 101 is cut by the dicing blade DB in the step of FIG. 4J. Thus, the stacked wafer structure 101 can be advantageously cut.

In the production process for the semiconductor device 51, the uniformity of the connection strengths at the juncture interfaces between the first to third semiconductor wafers 100*a*, 100*b*, 100*c* can be effectively enhanced, thereby improving the processing yield.

FIG. 7 is a schematic plan view illustrating a semiconductor wafer 200 according to a third embodiment of the present invention. The semiconductor wafer 200 according to the third embodiment differs from the semiconductor wafer 100 according to the first embodiment in that dummy rings 62 each having a rounded closed loop plan shape are provided instead of the dummy rings 6 each having a rectangular loop shape as seen in plan. The other arrangement is the same as that of the semiconductor wafer 100 according to the first embodiment. In FIG. 7, components corresponding to those shown in FIGS. 1 to 6B are designated by the same reference characters as in FIGS. 1 to 6B, and duplicate description will be omitted.

Where the dummy rings 62 are formed in the insulation layer 12 so as to each have edges curved to be continuously connected, the dummy rings 62 each have no angled corner. Even if a plurality of such semiconductor wafers 200 are stacked one on another, stresses occurring during processing are not concentrated on the corners of the dummy rings 62. Where these semiconductor wafers 200 are employed in the production processes for the semiconductor devices 1, 51 of the first and second embodiments, therefore, the connection strengths between semiconductor wafers 200*a*, 200*b*, 200*c* (between the semiconductor chips 20*a*, 20*b*, 20*c*) can be further enhanced. In the first and second embodiments, the back side dummy rings 32 and the buried dummy rings 52 each have a rectangular loop shape as seen in plan by way of example. Where the semiconductor wafers 200*a*, 200*b*, 200*c* are employed in the production processes for the semiconductor devices 1, 51, the back side dummy rings 32 and the buried dummy rings 52 are preferably also formed in a rounded closed loop shape as seen in plan like the dummy rings 62.

While the embodiments of the present invention have thus been described, the present invention may be embodied in other ways.

In the embodiments described above, the electrode regions 5 (back side electrode regions 31) are each surrounded by the single dummy ring 6 (back side dummy ring 32) by way of example, but may be surrounded by a plurality of dummy rings (back side dummy rings) by providing another dummy ring around the dummy ring 6 (back side dummy ring 32).

In the embodiments described above, the dummy rings 6, 62, 32, 52 each have a closed loop shape to surround the electrode region 5, 28, 31 by way of example. Instead of the closed loop dummy rings 6, 62, 32, 52, a plurality of linear dummy bumps may be employed, which are arranged in spaced relation along a closed region around the electrode region 5, 28, 31. Alternatively, a plurality of dot-shaped dummy bumps may be arranged along the closed region around the electrode region 5, 28, 31 (e.g., in a matrix array). Where these dummy bumps are employed, the area of the juncture interface between the first and second semiconductor wafers 100*a*, 100*b* (between the second and third semiconductor wafers 100*b*, 100*c*) is reduced as compared with the first embodiment. Therefore, the first embodiment is more preferred.

In the embodiments described above, the first and second semiconductor wafers 100*a*, 100*b* prepared through the steps of FIGS. 4A to 4D are connected to each other with the first bump electrodes 4*a* and the first dummy rings 6*a* being respectively connected to the second bump electrodes 4*b* and the second dummy rings 6*c* by way of example. Alternatively, a semiconductor wafer prepared through the steps of FIGS. 4A to 4D may be connected to a semiconductor wafer prepared only through the step of FIG. 4A.

In the first and second embodiments described above, the back side dummy ring 32 (buried dummy ring 52) has the same shape and is located at the same position as the first and second dummy rings 6a, 6b as seen in plan by way of example, but may have the same shape and be located at the same position as the third dummy ring 6c formed in the third semiconductor chip 20c (third semiconductor wafer 100c). In the second and third semiconductor chips 20b, 20c, therefore, the back side dummy ring 32 (buried dummy ring 52) may be configured and dimensioned differently from the first and second dummy rings 6a, 6b as seen in plan. As long as the back side dummy ring 32 (buried dummy ring 52) has the same shape and is located at the same position as the third dummy ring 6c, the object of the present invention can be achieved.

It should be understood that various design modifications may be made within the scope of the present invention defined by the following claims.

The invention claimed is:

1. A semiconductor device comprising:
 a first semiconductor chip;
 a second semiconductor chip having a front surface opposed to a front surface of the first semiconductor chip;
 a first electrode region including a first electrode provided between the first semiconductor chip and the second semiconductor chip to electrically connect the first semiconductor chip to the second semiconductor chip;
 an external terminal connected to at least one of the first semiconductor chip and the second semiconductor chip; and
 a conductive juncture portion provided between the first semiconductor chip and the second semiconductor chip as surrounding the first electrode region to connect the first semiconductor chip to the second semiconductor chip, the conductive juncture portion being entirely disposed outside the external terminal.

2. The semiconductor device according to claim 1, wherein the first electrode includes:
 a first bump provided on the front surface of the first semiconductor chip; and
 a second bump provided on the front surface of the second semiconductor chip to be electrically connected to the first bump,
 wherein the juncture portion includes:
 a first juncture portion provided on the front surface of the first semiconductor chip; and
 a second juncture portion provided on the front surface of the second semiconductor chip to be connected to the first juncture portion.

3. The semiconductor device according to claim 1, wherein the conductive juncture portion is disposed laterally with respect to the external terminal so as to not be disposed directly beneath the external terminal.

4. A semiconductor device comprising:
 a first semiconductor chip;
 a second semiconductor chip having a front surface opposed to a front surface of the first semiconductor chip;
 a first electrode region including a first electrode provided between the first semiconductor chip and the second semiconductor chip to electrically connect the first semiconductor chip to the second semiconductor chip;
 a conductive juncture portion provided between the first semiconductor chip and the second semiconductor chip as surrounding the first electrode region to connect the first semiconductor chip to the second semiconductor chip;
 a first insulation layer provided on the front surface of the first semiconductor chip; and
 a second insulation layer provided on the front surface of the second semiconductor chip;
 wherein the first electrode includes:
 a first bump provided on the front surface of the first semiconductor chip; and
 a second bump provided on the front surface of the second semiconductor chip to be electrically connected to the first bump,
 wherein the juncture portion includes:
 a first juncture portion provided on the front surface of the first semiconductor chip; and
 a second juncture portion provided on the front surface of the second semiconductor chip to be connected to the first juncture portion,
 wherein the first bump and the first juncture portion extend thicknesswise through the first insulation layer so as to be flush with a surface of the first insulation layer;
 wherein the second bump and the second juncture portion extend thicknesswise through the second insulation layer so as to be flush with a surface of the second insulation layer.

5. The semiconductor device according to claim 1,
 wherein the first semiconductor chip and the second semiconductor chip each include a semiconductor element,
 wherein the juncture portion is electrically isolated from the semiconductor elements of the first and second semiconductor chips.

6. The semiconductor device according to claim 1, further comprising a via-electrode region including a via-electrode extending thicknesswise from a back surface of the second semiconductor chip to be electrically connected to the first electrode.

7. The semiconductor device according to claim 6, wherein the via-electrode and the first electrode have the same shape and are located in overlapping positions as seen in plan.

8. The semiconductor device according to claim 6, further comprising:
 a third semiconductor chip having a front surface opposed to the back surface of the second semiconductor chip;
 a second electrode region including a second electrode provided between the second semiconductor chip and the third semiconductor chip to electrically connect the second semiconductor chip to the third semiconductor chip; and
 a back side juncture portion provided between the back surface of the second semiconductor chip and the front surface of the third semiconductor chip as surrounding the second electrode region to connect the second semiconductor chip to the third semiconductor chip.

9. The semiconductor device according to claim 8,
 wherein the second electrode includes:
 a first back side bump provided on the back surface of the second semiconductor chip to be combined integrally with the via-electrode and electrically connected to the via-electrode; and
 a second back side bump provided on the front surface of the third semiconductor chip to be electrically connected to the first back side bump,
 wherein the back side juncture portion includes:
 a first back side juncture portion provided on the back surface of the second semiconductor chip; and
 a second back side juncture portion provided on the front surface of the third semiconductor chip to be connected to the first back side juncture portion.

10. The semiconductor device according to claim 8, further comprising a buried juncture portion extending thicknesswise from the back surface of the second semiconductor chip as surrounding the via-electrode region and connected to the back side juncture portion provided between the back surface of the second semiconductor chip and the front surface of the third semiconductor chip.

11. The semiconductor device according to claim 10,
wherein the second electrode is provided on the front surface of the third semiconductor chip,
wherein the back side juncture portion is provided on the front surface of the third semiconductor chip.

12. A semiconductor device comprising:
a first semiconductor chip;
a second semiconductor chip having a front surface opposed to a front surface of the first semiconductor chip;
a first electrode region including a first electrode provided between the first semiconductor chip and the second semiconductor chip to electrically connect the first semiconductor chip to the second semiconductor chip;
an external terminal connected to at least one of the first semiconductor chip and the second semiconductor chip; and
a conductive juncture portion provided between the first semiconductor chip and the second semiconductor chip to surround the first electrode region to connect the first semiconductor chip to the second semiconductor chip, the conductive juncture portion being disposed on an outer lateral side of the external terminal.

13. The semiconductor device according to claim 12, wherein the conductive juncture portion is entirely disposed in an area which is not directly beneath the external terminal.

* * * * *